United States Patent
Okada et al.

(10) Patent No.: US 8,283,995 B2
(45) Date of Patent: *Oct. 9, 2012

(54) BALANCED-OUTPUT TRIPLEXER

(75) Inventors: Atsunori Okada, Tokyo (JP); Tatsuya Fukunaga, Tokyo (JP); Hideya Matsubara, Tokyo (JP)

(73) Assignee: TDK Corporation, Tokyo (JP)

( * ) Notice: Subject to any disclaimer, the term of this patent is extended or adjusted under 35 U.S.C. 154(b) by 383 days.

This patent is subject to a terminal disclaimer.

(21) Appl. No.: 12/588,208

(22) Filed: Oct. 7, 2009

(65) Prior Publication Data

US 2010/0123526 A1   May 20, 2010

(30) Foreign Application Priority Data

Nov. 17, 2008  (JP) ................................ 2008-292920

(51) Int. Cl.
H03H 7/46 (2006.01)
(52) U.S. Cl. .................... 333/132; 333/129; 333/134
(58) Field of Classification Search ............. 333/126, 333/129, 132, 134, 204
See application file for complete search history.

(56) References Cited

U.S. PATENT DOCUMENTS

| | | | |
|---|---|---|---|
| 6,876,840 B2 | 4/2005 | Shin et al. | |
| 7,397,328 B2 * | 7/2008 | Yasuda et al. | 333/204 |
| 7,495,528 B2 | 2/2009 | Fukunaga | |
| 7,612,634 B2 * | 11/2009 | Iwata | 333/133 |
| 7,880,562 B2 * | 2/2011 | Okada et al. | 333/134 |
| 2007/0024398 A1 | 2/2007 | Fukunaga | |

FOREIGN PATENT DOCUMENTS

| | | |
|---|---|---|
| JP | A-2003-198309 | 7/2003 |
| JP | 2005260835 A * | 9/2005 |
| JP | 2005311929 A * | 11/2005 |
| JP | A-2006-108824 | 4/2006 |
| JP | A-2006-211057 | 8/2006 |
| JP | A-2006-333258 | 12/2006 |
| JP | A-2007-060618 | 3/2007 |
| JP | A-2007-266897 | 10/2007 |

OTHER PUBLICATIONS

Jul. 11, 2012 Office Action issued in Japanese Patent Application 2008-292920 (with translation).

* cited by examiner

*Primary Examiner* — Seungsook Ham
(74) *Attorney, Agent, or Firm* — Oliff & Berridge, PLC

(57) ABSTRACT

A balanced-output triplexer includes: a first filter provided between an input terminal and a pair of first balanced output terminals; a second filter provided between the input terminal and a pair of second balanced output terminals; and a third filter provided between the input terminal and a pair of third balanced output terminals. All of the first to third filters are provided within a layered substrate. All of the balanced output terminals are disposed to be adjacent to one of the sides of the top surface of the layered substrate and one of the sides of the bottom surface of the layered substrate.

2 Claims, 22 Drawing Sheets

BALANCED-OUTPUT TRIPLEXER

BACKGROUND OF THE INVENTION

1. Field of the Invention

The present invention relates to a balanced-output triplexer which separates three signals of different frequency bands inputted to an input terminal, and outputs them as balanced signals from respective corresponding balanced output terminals.

2. Description of the Related Art

In recent years, miniaturization has been demanded of wireless communication apparatuses such as a wireless LAN (local area network) communication apparatus, a WiMAX™ (Worldwide Interoperability for Microwave Access) communication apparatus, and a cellular phone. Meanwhile, capability to process a plurality of reception signals of different frequency bands in a single apparatus has been required as well.

In order for a single wireless communication apparatus to process a plurality of reception signals of different frequency bands, it is necessary to implement means for separating the plurality of reception signals received by an antenna from each other. Among known means for separating three reception signals of different frequency bands are triplexers such as those described in JP-A-2003-198309, JP-A-2006-108824, JP-A-2006-211057, and JP-A-2006-333258. The conventional triplexers have been configured to output the three separated reception signals each in the form of an unbalanced signal.

When implemented in a wireless communication apparatus, a triplexer is connected to signal processing circuitry for performing amplification, demodulation and other processing on the three reception signals. Lately, this signal processing circuitry has often been configured as an integrated circuit. The integrated circuit is often designed to accept signals each in the form of a balanced signal. If a triplexer that outputs three reception signals each in the form of an unbalanced signal and an integrated circuit that accepts reception signals each in the form of a balanced signal are to be employed in a wireless communication apparatus, then it is necessary to provide baluns for converting unbalanced signals into balanced signals between the respective reception signal output terminals of the triplexer and the respective reception signal input terminals of the integrated circuit. However, this hampers the miniaturization of the wireless communication apparatus and makes it difficult to connect the respective reception signal output terminals of the triplexer to the respective reception signal input terminals of the integrated circuit.

OBJECT AND SUMMARY OF THE INVENTION

An object of the present invention is to provide a balanced-output triplexer capable of separating three signals of different frequency bands inputted to an input terminal and outputting them as balanced signals from respective corresponding balanced output terminals.

A balanced-output triplexer according to the present invention includes: an input terminal for inputting a first unbalanced signal of a first frequency band, a second unbalanced signal of a second frequency band higher than the first frequency band, and a third unbalanced signal of a third frequency band higher than the second frequency band; a pair of first balanced output terminals for outputting a first balanced signal corresponding to the first unbalanced signal; a pair of second balanced output terminals for outputting a second balanced signal corresponding to the second unbalanced signal; and a pair of third balanced output terminals for outputting a third balanced signal corresponding to the third unbalanced signal.

The balanced-output triplexer further includes: a first filter provided between the input terminal and the pair of first balanced output terminals, for passing signals having frequencies within the first frequency band selectively, and for converting the first unbalanced signal into the first balanced signal and outputting the first balanced signal to the pair of first balanced output terminals; a second filter provided between the input terminal and the pair of second balanced output terminals, for passing signals having frequencies within the second frequency band selectively, and for converting the second unbalanced signal into the second balanced signal and outputting the second balanced signal to the pair of second balanced output terminals; and a third filter provided between the input terminal and the pair of third balanced output terminals, for passing signals having frequencies within the third frequency band selectively, and for converting the third unbalanced signal into the third balanced signal and outputting the third balanced signal to the pair of third balanced output terminals.

The balanced-output triplexer further includes a layered substrate including a plurality of dielectric layers stacked. All of the first to third filters are provided within the layered substrate. The layered substrate has a plurality of surfaces each of which is defined by a plurality of sides. The first to third balanced output terminals are disposed to be adjacent to one of the plurality of sides of one of the plurality of surfaces of the layered substrate.

According to the balanced-output triplexer of the present invention, the first unbalanced signal inputted to the input terminal is converted into the first balanced signal through the first filter, and then outputted from the pair of first balanced output terminals. The second unbalanced signal inputted to the input terminal is converted into the second balanced signal through the second filter, and then outputted from the pair of second balanced output terminals. The third unbalanced signal inputted to the input terminal is converted into the third balanced signal through the third filter, and then outputted from the pair of third balanced output terminals.

The balanced-output triplexer of the present invention may include a plurality of additional terminals other than the first to third balanced output terminals. In this case, all of the terminals other than the first to third balanced output terminals may be disposed to be adjacent to any of the plurality of sides other than the one to which the first to third balanced output terminals are adjacent.

In the balanced-output triplexer of the present invention, the layered substrate may include a ground layer connected to the ground. The ground layer may be disposed such that first and second areas sandwiching the ground layer are created within the layered substrate. In this case, the first filter may be disposed in the first area, and the second filter and the third filter may be disposed in the second area.

In the balanced-output triplexer of the present invention, each of the first to third filters may include a pair of resonators that are connected to the corresponding pair of balanced output terminals, each of the resonators having an open end and a short-circuited end. In this case, each of the pair of resonators may be disposed such that a line connecting the open end to the short-circuited end is in parallel with the one of the plurality of sides to which the first to third balanced output terminals are adjacent.

According to the present invention, it is possible to provide a balanced-output triplexer capable of separating three signals of different frequency bands inputted to the input terminal, and outputting them as balanced signals from the respective corresponding pairs of balanced output terminals. Furthermore, the present invention allows miniaturization of an apparatus that uses the balanced-output triplexer, and facilitates connection of the balanced output terminals of the balanced-output triplexer to the input terminals of a circuit that receives the output signals of the balanced-output triplexer.

Other and further objects, features and advantages of the invention will appear more fully from the following description.

DETAILED DESCRIPTION OF THE PREFERRED EMBODIMENT

Hereinafter, an embodiment of the present invention will be described with reference to the drawings. A balanced-output triplexer according to the embodiment of the invention separates signals of first, second and third frequency bands to be described below from each other. The second frequency band is higher than the first frequency band, and the third frequency band is higher than the second frequency band. The first frequency band is a 2.4-GHz band for use in IEEE 802.11b and IEEE 802.11g, for example. The second frequency band is a 3.5-GHz band for use in WiMAX standards, for example. The third frequency band is a 5-GHz band for use in IEEE 802.11a, for, example. The first frequency band and the third frequency band are used for a wireless LAN, for example. The second frequency band is used for WiMAX communications, for example.

Figure 1:
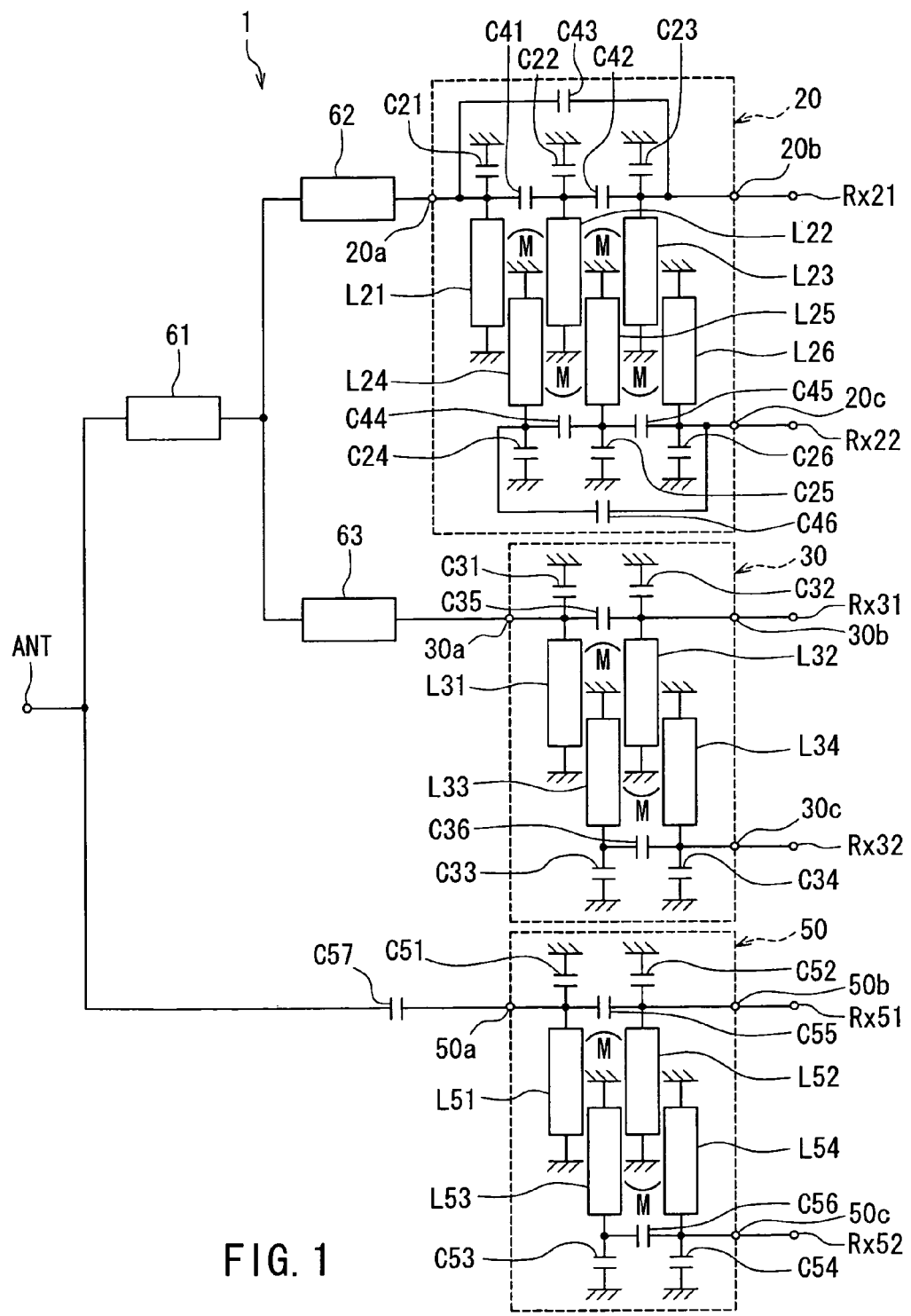
FIG. 1 is a circuit diagram showing the circuit configuration of a balanced-output triplexer according to an embodiment of the present invention.

FIG. 1 is a circuit diagram showing the circuit configuration of the balanced-output triplexer according to the present embodiment. The balanced-output triplexer (hereinafter simply referred to as triplexer) 1 according to the present embodiment includes an input terminal ANT, a pair of first balanced output terminals Rx21 and Rx22, a pair of second balanced output terminals Rx31 and Rx32, and a pair of third balanced output terminals Rx51 and Rx52. A first unbalanced signal of the first frequency band, a second unbalanced signal of the second frequency band, and a third unbalanced signal of the third frequency band are inputted to the input terminal ANT. The input terminal ANT is connected to an antenna. All the first to third unbalanced signals are reception signals that are received by the antenna. The pair of first balanced output terminals Rx21 and Rx22 output a first balanced signal corresponding to the first unbalanced signal. The pair of second balanced output terminals Rx31 and Rx32 output a second balanced signal corresponding to the second unbalanced signal. The pair of third balanced output terminals Rx51 and Rx52 output a third balanced signal corresponding to the third unbalanced signal. These balanced output terminals are connected to signal processing circuitry (such as a single integrated circuit) for performing amplification, demodulation and other processing on the three reception signals.

The triplexer 1 further includes a first filter 20, a second filter 30, and a third filter 50. The first filter 20 is provided between the input terminal ANT and the first balanced output terminals Rx21 and Rx22. The second filter 30 is provided between the input terminal ANT and the second balanced output terminals Rx31 and Rx32. The third filter 50 is provided between the input terminal ANT and the third balanced output terminals Rx51 and Rx52. Each of the first to third filters 20, 30 and 50 is a band-pass filter and has the function of converting an unbalanced signal into a balanced signal. The first filter 20 passes signals having frequencies within the first frequency band selectively. The first filter 20 converts the first unbalanced signal into the first balanced signal, and outputs this first balanced signal to the first balanced output terminals Rx21 and Rx22. The second filter 30 passes signals having frequencies within the second frequency band selectively. The second filter 30 converts the second unbalanced signal into the second balanced signal, and outputs this second balanced signal to the second balanced output terminals Rx31 and Rx32. The third filter 50 passes signals having frequencies within the third frequency band selectively. The third filter 50 converts the third unbalanced signal into the third balanced signal, and outputs this third balanced signal to the third balanced output terminals Rx51 and Rx52.

The triplexer 1 further includes phase lines 61, 62 and 63, and a capacitor C57. An end of the phase line 61 is connected to the input terminal ANT. An end of each of the phase lines 62 and 63 is connected to the other end of the phase line 61. The other end of the phase line 62 is connected to the first filter 20. The other end of the phase line 63 is connected to the second filter 30. An end of the capacitor C57 is connected to the input terminal ANT, and the other end of the capacitor C57 is connected to the third filter 50.

The filter 20 has an input port 20a and two output ports 20b and 20c. The input port 20a is connected to the phase line 62. The output ports 20b and 20c are connected to the first balanced output terminals Rx21 and Rx22, respectively.

The filter 20 further includes resonators L21, L22 and L23, and capacitors C21, C22, C23, C41, C42 and C43. Each of the resonators L21, L22 and L23 has an open end and a short-circuited end. The input port 20a is connected to the resonator L21. For the sake of convenience, FIG. 1 shows the input port 20a as being connected to the open end of the resonator L21; however, the input port 20a may be connected to any part of the resonator L21 except the short-circuited end. An end of each of the capacitors C21, C41 and C43 is connected to the open end of the resonator L21. The short-circuited end of the resonator L21 and the other end of the capacitor C21 are grounded. The open end of the resonator L22 and an end of each of the capacitors C22 and C42 are connected to the other end of the capacitor C41. The short-circuited end of the resonator L22 and the other end of the capacitor C22 are grounded. The open end of the resonator L23 and an end of the capacitor C23, and the other end of the capacitor C43 are connected to the other end of the capacitor C42. The short-circuited end of the resonator L23 and the other end of the capacitor C23 are grounded. The output port 20b is connected to the resonator L23. For the sake of convenience, FIG. 1 shows the output port 20b as being connected to the open end of the resonator L23; however, the output port 20b may be connected to any part of the resonator L23 except the short-circuited end.

A group of the resonator L21 and the capacitor C21, a group of the resonator L22 and the capacitor C22, and a group of the resonator L23 and the capacitor C23 each constitute a quarter wave resonator. The capacitors C21, C22 and C23 have the function of making the respective physical lengths of the resonators L21, L22 and L23 shorter than the quarter wavelength of the signal to be passed through the filter 20. The resonator L21 and the resonator L22 are electromagnetically coupled to each other. That is, the resonator L21 and the resonator L22 are inductively coupled to each other, and are also capacitively coupled to each other through the capacitor C41. Similarly, the resonator L22 and the resonator L23 are electromagnetically coupled to each other. That is, the resonator L22 and the resonator L23 are inductively coupled to each other, and are also capacitively coupled to each other through the capacitor C42. In FIG. 1, the inductive coupling between the resonators L21 and L22 and the inductive coupling between the resonators L22 and L23 are each indicated with a curve with reference character M. The inductive coupling between the resonators L21 and L22 and the inductive coupling between the resonators L22 and L23 are both combline coupling in which the two resonators are the same in positional relationship between the open end and the short-circuited end. Two resonators being the same in positional relationship between the open end and the short-circuited end shall mean that the direction from the open end to the short-circuited end of one of the two resonators is the same or nearly the same as the direction from the open end to the short-circuited end of the other of the two resonators.

The filter 20 further includes resonators L24, L25 and L26, and capacitors C24, C25, C26, C44, C45 and C46. Each of the resonators L24, L25 and L26 has an open end and a short-circuited end. The open end of the resonator L24 and an end of each of the capacitors C24 and C46 are connected to an end of the capacitor C44. The short-circuited end of the resonator L24 and the other end of the capacitor C24 are grounded. The open end of the resonator L25 and an end of each of the capacitors C25 and C45 are connected to the other end of the capacitor C44. The short-circuited end of the resonator L25 and the other end of the capacitor C25 are grounded. The open end of the resonator L26 and an end of the capacitor C26, and the other end of the capacitor C46 are connected to the other end of the capacitor C45. The short-circuited end of the resonator L26 and the other end of the capacitor C26 are grounded. The output port 20c is connected to the resonator L26. For the sake of convenience, FIG. 1 shows the output port 20c as being connected to the open end of the resonator L26; however, the output port 20c may be connected to any part of the resonator L26 except the short-circuited end.

A group of the resonator L24 and the capacitor C24, a group of the resonator L25 and the capacitor C25, and a group of the resonator L26 and the capacitor C26 each constitute a quarter wave resonator. The capacitors C24, C25 and C26 have the function of making the respective physical lengths of the resonators L24, L25 and L26 shorter than the quarter wavelength of the signal to be passed through the filter 20. The resonator L24 and the resonator L25 are electromagnetically coupled to each other. That is, the resonator L24 and the resonator L25 are inductively coupled to each other, and are also capacitively coupled to each other through the capacitor C44. Similarly, the resonator L25 and the resonator L26 are electromagnetically coupled to each other. That is, the resonator L25 and the resonator L26 are inductively coupled to each other, and are also capacitively coupled to each other through the capacitor C45. In FIG. 1, the inductive coupling between the resonators L24 and L25 and the inductive coupling between the resonators L25 and L26 are each indicated with a curve with reference character M. The inductive coupling between the resonators L24 and L25 and the inductive coupling between the resonators L25 and L26 are both combline coupling in which the two resonators are the same in positional relationship between the open end and the short-circuited end.

A pair of the resonator L21 and the resonator L24 are interdigital-coupled to each other; a pair of the resonator L22 and the resonator L25 are interdigital-coupled to each other; and a pair of the resonator L23 and the resonator L26 are interdigital-coupled to each other. That is, the resonator L21 and the resonator L24 are opposed to each other such that they are opposite in positional relationship between the open end and the short-circuited end, and these resonators L21 and L24 are electromagnetically coupled to each other. The resonator L22 and the resonator L25 are opposed to each other such that they are opposite in positional relationship between the open end and the short-circuited end, and these resonators L22 and L25 are electromagnetically coupled to each other. The resonator L23 and the resonator L26 are opposed to each other such that they are opposite in positional relationship between the open end and the short-circuited end, and these resonators L23 and L26 are electromagnetically coupled to each other.

In the filter 20, the signal from the input terminal ANT is inputted to the resonator L21. The resonators L21 and L24 correspond to a pair of input resonators. The resonators L23 and L26 correspond to a pair of output resonators according to the present invention. The resonators L21 and L24 are coupled to the resonators L22 and L25. The resonators L22 and L25 are coupled to the resonators L23 and L26. Consequently, the resonators L21 and L24 are coupled to the resonators L23 and L26 through the resonators L22 and L25.

The filter 30 has an input port 30a and two output ports 30b and 30c. The input port 30a is connected to the phase line 63. The output ports 30b and 30c are connected to the second balanced output terminals Rx31 and Rx32, respectively.

The filter 30 further includes resonators L31 and L32, and capacitors C31, C32 and C35. Each of the resonators L31 and L32 has an open end and a short-circuited end. The input port 30a is connected to the resonator L31. For the sake of convenience, FIG. 1 shows the input port 30a as being connected to the open end of the resonator L31; however, the input port 30a may be connected to any part of the resonator L31 except the short-circuited end. An end of each of the capacitors C31 and C35 is connected to the open end of the resonator L31. The short-circuited end of the resonator L31 and the other end of the capacitor C31 are grounded. The open end of the resonator L32 and an end of the capacitor C32 are connected to the other end of the capacitor C35. The short-circuited end of the resonator L32 and the other end of the capacitor C32 are grounded. The output port 30b is connected to the resonator L32. For the sake of convenience, FIG. 1 shows the output port 30b as being connected to the open end of the resonator L32; however, the output port 30b may be connected to any part of the resonator L32 except the short-circuited end.

A group of the resonator L31 and the capacitor C31, and a group of the resonator L32 and the capacitor C32 each constitute a quarter wave resonator. The capacitors C31 and C32 have the function of making the respective physical lengths of the resonators L31 and L32 shorter than the quarter wavelength of the signal to be passed through the filter 30. The resonator L31 and the resonator L32 are electromagnetically coupled to each other. That is, the resonator L31 and the resonator L32 are inductively coupled to each other, and are also capacitively coupled to each other through the capacitor C35. In FIG. 1, the inductive coupling between the resonators L31 and L32 is indicated with a curve with reference character M. The inductive coupling between the resonators L31 and L32 is combline coupling in which the two resonators are the same in positional relationship between the open end and the short-circuited end.

The filter 30 further includes resonators L33 and L34, and capacitors C33, C34 and C36. Each of the resonators L33 and L34 has an open end and a short-circuited end. The open end of the resonator L33 and an end of the capacitor C33 are connected to an end of the capacitor C36. The short-circuited end of the resonator L33 and the other end of the capacitor C33 are grounded. The open end of the resonator L34 and an end of the capacitor C34 are connected to the other end of the capacitor C36. The short-circuited end of the resonator L34 and the other end of the capacitor C34 are grounded. The output port 30c is connected to the resonator L34. For the sake of convenience, FIG. 1 shows the output port 30c as being connected to the open end of the resonator L34; however, the output port 30c may be connected to any part of the resonator L34 except the short-circuited end.

A group of the resonator L33 and the capacitor C33, and a group of the resonator L34 and the capacitor C34 each constitute a quarter wave resonator. The capacitors C33 and C34 have the function of making the respective physical lengths of the resonators L33 and L34 shorter than the quarter wavelength of the signal to be passed through the filter 30. The resonator L33 and the resonator L34 are electromagnetically coupled to each other. That is, the resonator L33 and the resonator L34 are inductively coupled to each other, and are also capacitively coupled to each other through the capacitor C36. In FIG. 1, the inductive coupling between the resonators L33 and L34 is indicated with a curve with reference character M. The inductive coupling between the resonators L33 and L34 is combline coupling in which the two resonators are the same in positional relationship between the open end and the short-circuited end.

A pair of the resonator L31 and the resonator L33 are interdigital-coupled to each other; and a pair of the resonator L32 and the resonator L34 are interdigital-coupled to each other. That is, the resonator L31 and the resonator L33 are opposed to each other such that they are opposite in positional relationship between the open end and the short-circuited end, and these resonators L31 and L33 are electromagnetically coupled to each other. The resonator L32 and the resonator L34 are opposed to each other such that they are opposite in positional relationship between the open end and the short-circuited end, and these resonators L32 and L34 are electromagnetically coupled to each other.

In the filter 30, the signal from the input terminal ANT is inputted to the resonator L31. The resonators L31 and L33 correspond to a pair of input resonators. The resonators L32 and L34 correspond to a pair of output resonators according to the present invention. The resonators L31 and L33 are directly coupled to the resonators L32 and L34.

The filter 50 has an input port 50a and two output ports 50b and 50c. The input port 50a is connected to the capacitor C57. The output ports 50b and 50c are connected to the third balanced output terminals Rx51 and Rx52, respectively.

The filter 50 further includes resonators L51 and L52, and capacitors C51, C52 and C55. Each of the resonators L51 and L52 has an open end and a short-circuited end. The open end of the resonator L51 and an end of each of the capacitors C51 and C55 are connected to the input port 50a. The short-circuited end of the resonator L51 and the other end of the capacitor C51 are grounded. The open end of the resonator L52 and an end of the capacitor C52 are connected to the other end of the capacitor C55. The short-circuited end of the resonator L52 and the other end of the capacitor C52 are grounded. The output port 50b is connected to the resonator L52. For the sake of convenience, FIG. 1 shows the output port 50b as being connected to the open end of the resonator L52; however, the output port 50b may be connected to any part of the resonator L52 except the short-circuited end.

A group of the resonator L51 and the capacitor C51, and a group of the resonator L52 and the capacitor C52 each constitute a quarter wave resonator. The capacitors C51 and C52 have the function of making the respective physical lengths of the resonators L51 and L52 shorter than the quarter wavelength of the signal to be passed through the filter 50. The resonator L51 and the resonator L52 are electromagnetically coupled to each other. That is, the resonator L51 and the resonator L52 are inductively coupled to each other, and are also capacitively coupled to each other through the capacitor C55. In FIG. 1; the inductive coupling between the resonators L51 and L52 is indicated with a curve with reference character M. The inductive coupling between the resonators L51 and L52 is combline coupling in which the two resonators are the same in positional relationship between the open end and the short-circuited end.

The filter 50 further includes resonators L53 and L54, and capacitors C53, C54 and C56. Each of the resonators L53 and L54 has an open end and a short-circuited end. The open end of the resonator L53 and an end of the capacitor C53 are connected to an end of the capacitor C56. The short-circuited end of the resonator L53 and the other end of the capacitor C53 are grounded. The open end of the resonator L54 and an end of the capacitor C54 are connected to the other end of the capacitor C56. The short-circuited end of the resonator L54 and the other end of the capacitor C54 are grounded. The output port 50c is connected to the resonator L54. For the sake of convenience, FIG. 1 shows the output port 50c as being connected to the open end of the resonator L54; however, the output port 50c may be connected to any part of the resonator L54 except the short-circuited end.

A group of the resonator L53 and the capacitor C53, and a group of the resonator L54 and the capacitor C54 each constitute a quarter wave resonator. The capacitors C53 and C54 have the function of making the respective physical lengths of the resonators L53 and L54 shorter than the quarter wavelength of the signal to be passed through the filter 50. The resonator L53 and the resonator L54 are electromagnetically coupled to each other. That is, the resonator L53 and the resonator L54 are inductively coupled to each other, and are also capacitively coupled to each other through the capacitor C56. In FIG. 1, the inductive coupling between the resonators L53 and L54 is indicated with a curve with reference character M. The inductive coupling between the resonators L53 and L54 is combline coupling in which the two resonators are the same in positional relationship between the open end and the short-circuited end.

A pair of the resonator L51 and the resonator L53 are interdigital-coupled to each other; and a pair of the resonator L52 and the resonator L54 are interdigital-coupled to each other. That is, the resonator L51 and the resonator L53 are opposed to each other such that they are opposite in positional relationship between the open end and the short-circuited end, and these resonators L51 and L53 are electromagnetically coupled to each other. The resonator L52 and the resonator L54 are opposed to each other such that they are opposite in positional relationship between the open end and the short-circuited end, and these resonators L52 and L54 are electromagnetically coupled to each other.

In the filter 50, the signal from the input terminal ANT is inputted to the resonator L51. The resonators L51 and L53 correspond to a pair of input resonators. The resonators L52 and L54 correspond to a pair of output resonators according to the present invention. The resonators L51 and L53 are directly coupled to the resonators L52 and L54.

Each of the resonators L21 to L23, L41 to L43, L31 to L34, and L51 to L54 is a distributed constant line made of a TEM line. A TEM line refers to a transmission line that transmits a TEM wave (a transverse electromagnetic wave), which is an electromagnetic wave that has an electric field and a magnetic field only within cross sections perpendicular to the direction of travel of the electromagnetic wave.

Next, the functions of the phase lines 61, 62 and 63 and the capacitor C57 will be described. The signal path from the input terminal ANT to the first balanced output terminals Rx21 and Rx22 will be referred to as a first signal path. The signal path from the input terminal ANT to the second balanced output terminals Rx31 and Rx32 will be referred to as a second signal path. The signal path from the input terminal ANT to the third balanced output terminals Rx51 and Rx52 will be referred to as a third signal path. The phase lines 61, 62 and 63 and the capacitor C57 are intended to adjust the impedance characteristics of the first to third signal paths. Now, first and second examples will be given of a method of adjusting the impedance characteristics of the first to third signal paths. Note that the method of adjusting the impedance characteristics of the first to third signal paths is not limited to the following first and second examples.

Initially, a description will be given of the first example of the method of adjusting the impedance characteristics of the first to third signal paths. In the first example, the impedance characteristics of the first to third signal paths are adjusted so that the following conditions (1) to (3) are satisfied.

(1) For the first frequency band:

(1a) An entire parallel circuit made up of the second and third signal paths has a reflection coefficient of 1 or near 1 when viewed from the input terminal ANT; and (1b) The second signal path by itself and the third signal path by itself each have a reflection coefficient of neither −1 nor near −1 when viewed from the input terminal ANT.

(2) For the second frequency band:

(2a) An entire parallel circuit made up of the first and third signal paths has a reflection coefficient of 1 or near 1 when viewed from the input terminal ANT; and (2b) The first signal path by itself and the third signal path by itself each have a reflection coefficient of neither −1 nor near −1 when viewed from the input terminal ANT.

(3) For the third frequency band:

(3a) An entire parallel circuit made up of the first and second signal paths has a reflection coefficient of 1 or near 1 when viewed from the input terminal ANT; and (3b) The first signal path by itself and the second signal path by itself each have a reflection coefficient of neither −1 nor near −1 when viewed from the input terminal ANT.

A reflection coefficient is a complex number expressed as U+jV, where U is the real part and V is the imaginary part. Here, "j" represents $\sqrt{(-1)}$.

In (1a), (2a) and (3a), "a reflection coefficient of 1 or near 1" means that the signal paths are open (infinite impedance) or in a similar state thereto when viewed from the input terminal ANT. For example, "a reflection coefficient of 1 or near 1" refers to that U falls within the range of 0.75 to 1 and V falls within the range of −0.25 to 0.25.

In (1b), (2b), and (3b), "a reflection coefficient of neither −1 nor near −1" means that the signal paths are neither short-circuited (zero impedance) nor in a similar state thereto when viewed from the input terminal ANT. For example, "a reflection coefficient of neither −1 nor near −1" refers to that at least one of the following are satisfied: U falls out of the range of −1 to −0.75; and V falls out of the range of −0.25 to 0.25.

Next, a description will be given of the second example of the method of adjusting the impedance characteristics of the first to third signal paths. In this second example, the impedance characteristics of the first to third signal paths are adjusted so that the following conditions (1c), (2c) and (3c) are satisfied with the first to third signal paths connected in parallel.

(1c) For the first frequency band, the first signal path has a reflection coefficient of 0 or near 0 in absolute value when viewed from the input terminal ANT.

(2c) For the second frequency band, the second signal path has a reflection coefficient of 0 or near 0 in absolute value when viewed from the input terminal ANT.

(3c) For the third frequency band, the third signal path has a reflection coefficient of 0 or near 0 in absolute value when viewed from the input terminal ANT.

In (1c), (2c) and (3c), "a reflection coefficient of 0 or near 0 in absolute value" means that the signal paths are non-reflective (impedance matched) or in a similar state thereto when viewed from the input terminal ANT. For example, "a reflection coefficient of 0 or near 0 in absolute value" refers to that the reflection coefficient has an absolute value within the range of 0 to 0.3.

Now, the principle operation of the triplexer 1 according to the present embodiment will be described. In the triplexer 1, the first unbalanced signal inputted to the input terminal ANT is converted into the first balanced signal through the first filter 20, and then outputted from the pair of first balanced output terminals Rx21 and Rx22. The second unbalanced signal inputted to the input terminal ANT is converted into the second balanced signal through the second filter 30, and then outputted from the pair of second balanced output terminals Rx31 and Rx32. The third unbalanced signal inputted to the input terminal ANT is converted into the third balanced signal through the third filter 50, and then outputted from the pair of third balanced output terminals Rx51 and Rx52.

Next, the operation of the filters 20, 30 and 50 will be described. In general, two resonators having the same resonant frequency show two different resonant frequencies if they are put close to each other and electromagnetically coupled to each other. Assuming that two resonators have a resonant frequency of f0 when they are not electromagnetically coupled, the two resonators show a first resonant frequency f1 lower than f0 and a second resonant frequency f2 higher than f0 when they are electromagnetically coupled. If the two resonators are interdigital-coupled to each other, the two resonators produce electric fields with a phase difference of 180° therebetween except at their short-circuited ends when the two resonators resonate at the first resonant frequency f1. In this case, it is therefore possible to output a balanced signal of frequency f1 from the two resonators except the short-circuited ends. Each of the filters 20, 30 and 50 uses this principle to output a balanced signal from a pair of interdigital-coupled output resonators thereof. Each filter has a pass band in the vicinity of the first resonant frequency f1 defined for each filter.

The pass band of the first filter 20 is set to cover the first frequency band. In the first filter 20, the signal from the input terminal ANT is inputted to the resonator L21. The first filter 20 passes signals having frequencies within the pass band selectively, by means of the resonance of the resonators with the signals having the frequencies within the pass band. Here, the pair of interdigital-coupled resonators L21 and L24, the pair of interdigital-coupled resonators L22 and L25, and the pair of interdigital-coupled resonators L23 and L26 produce electric fields with a phase difference of approximately 180° between the two resonators except at the short-circuited ends.

Consequently, the first balanced signal is outputted from the pair of output ports 20b and 20c which are connected to the resonators L23 and L26, i.e., a pair of output resonators.

The pass band of the second filter 30 is set to cover the second frequency band. In the second filter 30, the signal from the input terminal ANT is inputted to the resonator L31. The second filter 30 passes signals having frequencies within the pass band selectively, by means of the resonance of the resonators with the signals having the frequencies within the pass band. Here, the pair of interdigital-coupled resonators L31 and L33, and the pair of interdigital-coupled resonators L32 and L34 produce electric fields with a phase difference of approximately 180° between the two resonators except at the short-circuited ends. Consequently, the second balanced signal is outputted from the pair of output ports 30b and 30c which are connected to the resonators L32 and L34, i.e., a pair of output resonators.

The pass band of the third filter 50 is set to cover the third frequency band. In the third filter 50, the signal from the input terminal ANT is inputted to the resonator L51. The third filter 50 passes signals having frequencies within the pass band selectively, by means of the resonance of the resonators with the signals having the frequencies within the pass band. Here, the pair of interdigital-coupled resonators L51 and L53, and the pair of interdigital-coupled resonators L52 and L54 produce electric fields with a phase difference of approximately 180° between the two resonators except at the short-circuited ends. Consequently, the third balanced signal is outputted from the pair of output ports 50b and 50c which are connected to the resonators L52 and L54, i.e., a pair of output resonators.

Each of the filters 20, 30 and 50 has a pair of output resonators interdigital-coupled to each other, and can thus provide a pass band in the vicinity of the resonant frequency f1 that is lower than the resonant frequency f0 of the output resonators when not in electromagnetic coupling. For a resonator not electromagnetically coupled to another resonator, it is required to increase the physical length of the resonator if a lower resonant frequency is desired. Each of the filters 20, 30, and 50 can achieve a pass band in the vicinity of the resonant frequency f1 by using resonators that are designed to provide the resonant frequency f0 when not in electromagnetic coupling, that is, resonators smaller than ones that are designed to provide the resonant frequency f1 when not in electromagnetic coupling. In consequence, it is possible for each of the filters 20, 30, and 50 to achieve miniaturization of resonators by having a pair of output resonators interdigital-coupled to each other.

Figure 2:
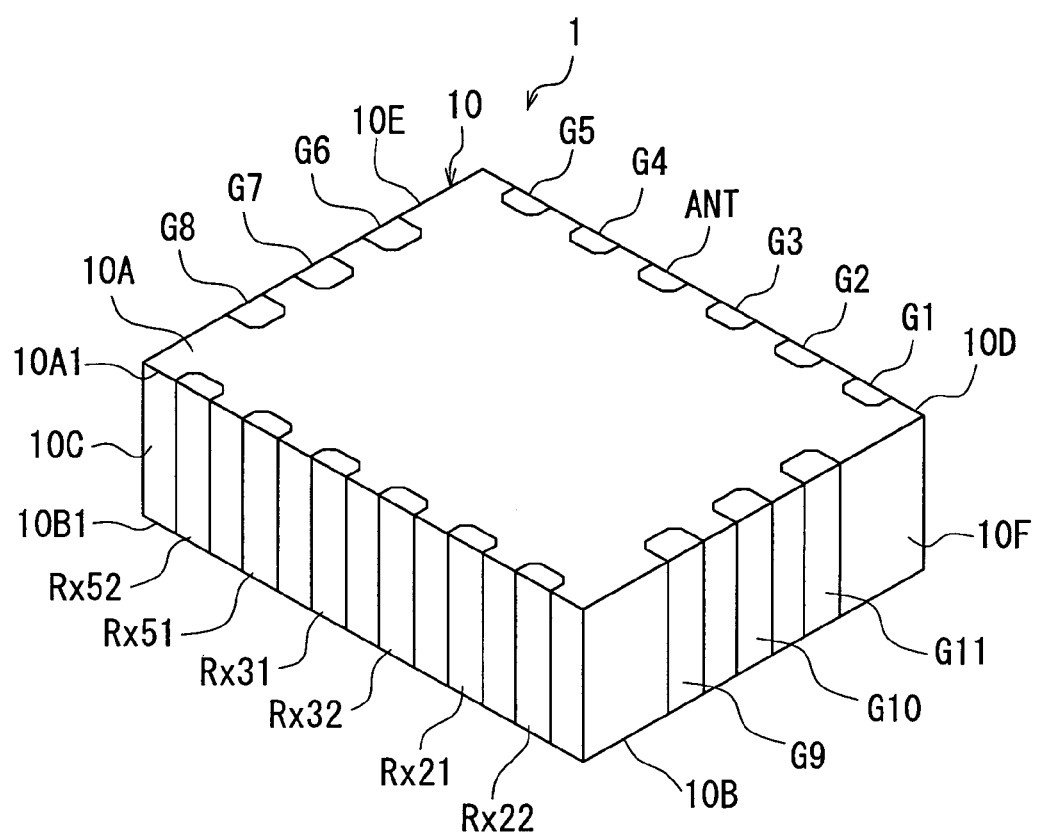
FIG. 2 is a perspective view showing the appearance of the balanced-output triplexer according to the embodiment of the present invention.

The structure of the triplexer 1 will be described below. FIG. 2 is a perspective view showing the appearance of the triplexer 1. As shown in FIG. 2, the triplexer 1 includes a layered substrate 10 that includes a plurality of dielectric layers stacked. The layered substrate 10 is a multilayer substrate of low-temperature co-fired ceramic, for example. The filters 20, 30 and 50, the phase lines 61, 62 and 63, and the capacitor C57 shown in FIG. 1 are formed within the layered substrate 10.

The layered substrate 10 has a plurality of surfaces each of which is defined by a plurality of sides. Specifically, the layered substrate 10 has a rectangular solid shape, with a top surface 10A, a bottom surface 10B, and four side surfaces 10C to 10F. The top surface 10A, the bottom surface 10B and the four side surfaces 10C to 10F are each defined by four sides. The four side surfaces 10C to 10F connect the top surface 10A and the bottom surface 10B to each other. The top surface 10A and the bottom surface 10B face toward opposite directions to each other; the side surfaces 10C and 10D face toward opposite directions to each other; and the side surfaces 10E and 10F face toward opposite directions to each other. The side surfaces 10C to 10F are perpendicular to the top surface 10A and the bottom surface 10B. In the layered substrate 10, the direction perpendicular to the top surface 10A and the bottom surface 10B is the stacking direction of the plurality of dielectric layers. The top surface 10A and the bottom surface 10B are located at opposite ends of the layered substrate 10 in the stacking direction of the plurality of dielectric layers.

The triplexer 1 includes ground terminals G1 to G11, in addition to the terminals ANT, Rx21, Rx22, Rx31, Rx32, Rx51 and Rx52 described previously. The ground terminals G1 to G11 are connected to an external ground. The terminals Rx21, Rx22, Rx31, Rx32, Rx51 and Rx52 are arranged to extend from the top surface 10A through the side surface 10C to the bottom surface 10B. The terminals ANT and G1 to G5 are arranged to extend from the top surface 10A through the side surface 10D to the bottom surface 10B. The terminals G6 to G8 are arranged to extend from the top surface 10A through the side surface 10E to the bottom surface 10B. The terminals G9 to G11 are arranged to extend from the top surface 10A through the side surface 10F to the bottom surface 10B.

The top surface 10A has four sides which are formed of ridges between the top surface 10A and the four side surfaces 10C, 10D, 10E and 10F, respectively. The bottom surface 10B also has four sides which are formed of ridges between the bottom surface 10B and the four side surfaces 10C, 10D, 10E and 10F, respectively. In the top surface 10A, the balanced output terminals Rx21, Rx22, Rx31, Rx32, Rx51 and Rx52 are disposed to be adjacent to a side 10A1 which is formed of the ridge between the top surface 10A and the side surface 10C. In the bottom surface 10B, the balanced output terminals Rx21, Rx22, Rx31, Rx32, Rx51 and Rx52 are disposed to be adjacent to a side 10B1 which is formed of the ridge between the bottom surface 10B and the side surface 10C. In the top surface 10A and the bottom surface 10B, all the terminals other than the balanced output terminals are disposed to be adjacent to sides other than the sides 10A1 and 10B1 to which the balanced output terminals Rx21, Rx22, Rx31, Rx32, Rx51 and Rx52 are adjacent.

Figure 3A:
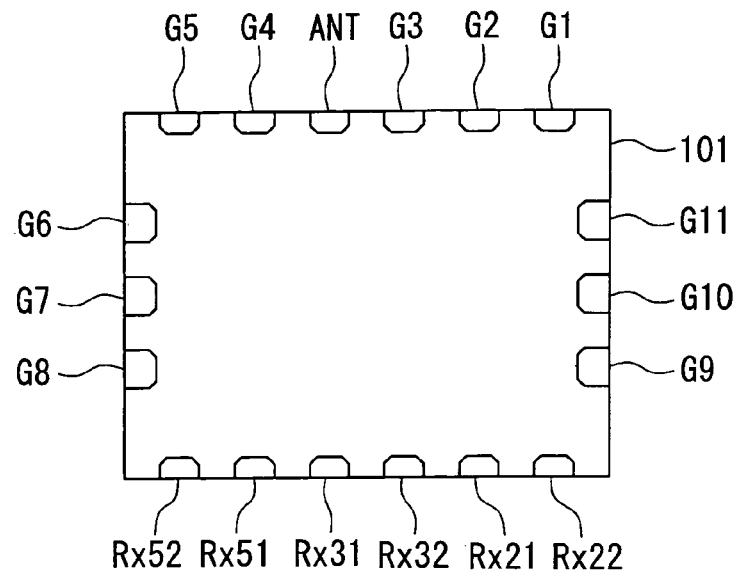
FIG. 3A is a top view showing the top surface of a first dielectric layer of the layered substrate shown in FIG. 2.
Figure 3B:
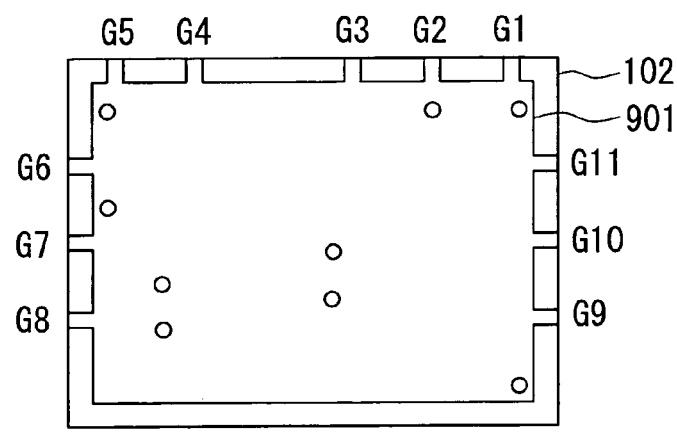
FIG. 3B is a top view showing the top surface of a second dielectric layer of the layered substrate shown in FIG. 2.
Figure 3C:
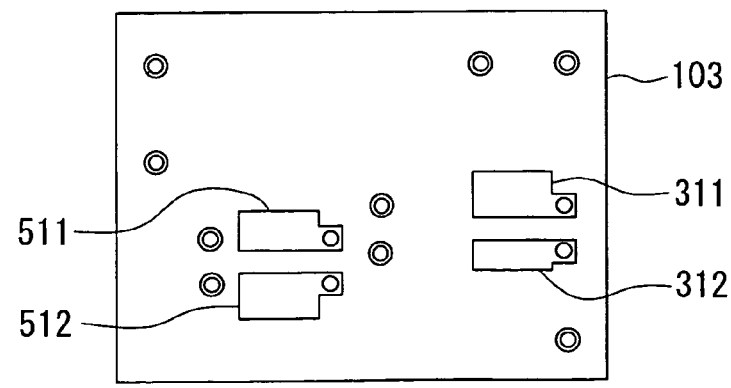
FIG. 3C is a top view showing the top surface of a third dielectric layer of the layered substrate shown in FIG. 2.
Figure 4A:
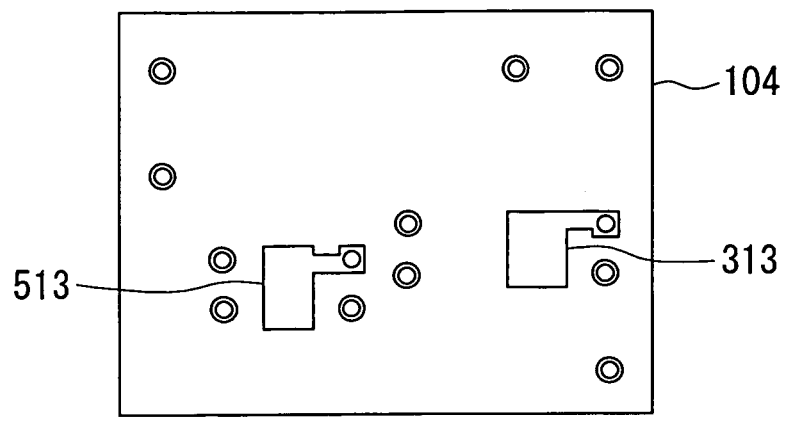
FIG. 4A is a top view showing the top surface of a fourth dielectric layer of the layered substrate shown in FIG. 2.
Figure 4B:
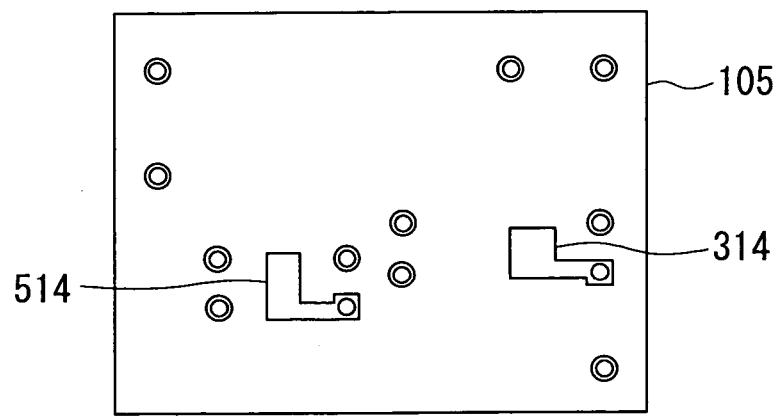
FIG. 4B is a top view showing the top surface of a fifth dielectric layer of the layered substrate shown in FIG. 2.
Figure 4C:
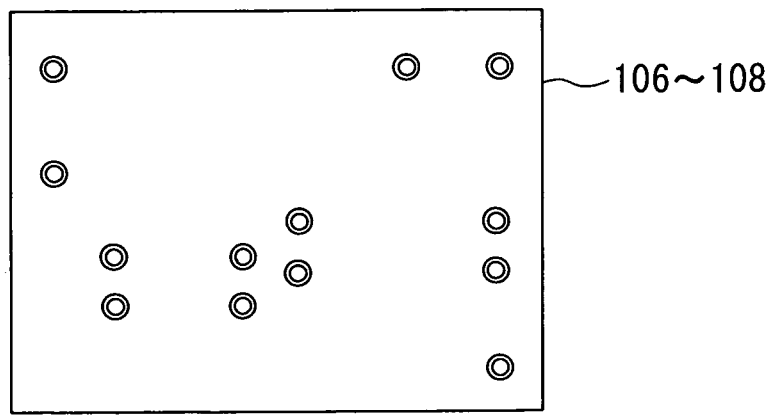
FIG. 4C is a top view showing the top surface of a sixth to an eighth dielectric layer of the layered substrate shown in FIG. 2.
Figure 5A:
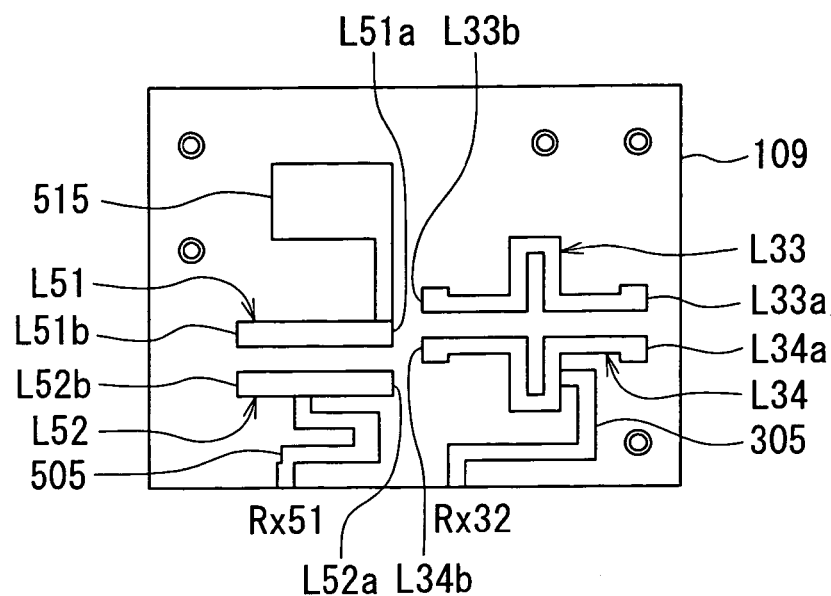
FIG. 5A is a top view showing the top surface of a ninth dielectric layer of the layered substrate shown in FIG. 2.
Figure 5B:
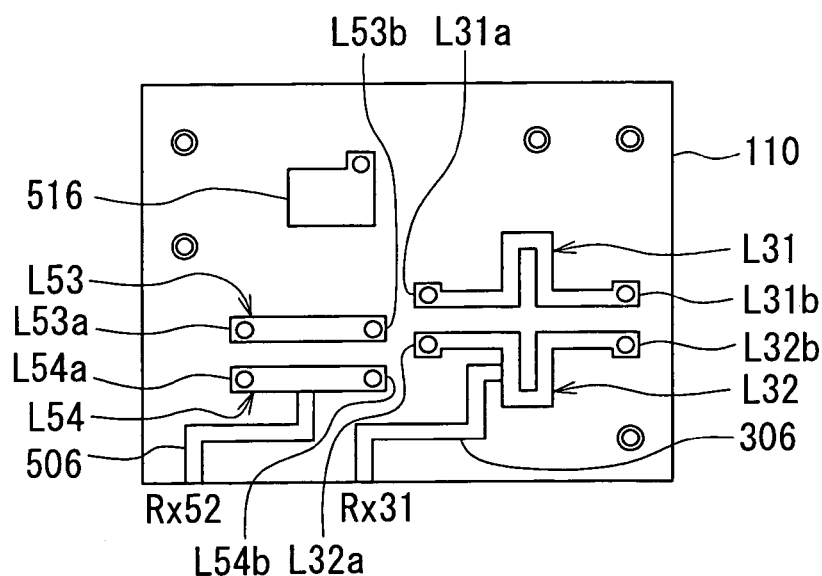
FIG. 5B is a top view showing the top surface of a tenth dielectric layer of the layered substrate shown in FIG. 2.
Figure 5C:
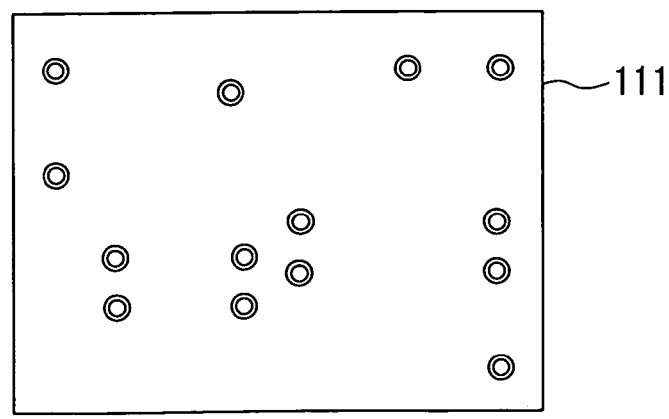
FIG. 5C is a top view showing the top surface of an eleventh dielectric layer of the layered substrate shown in FIG. 2.
Figure 6A:
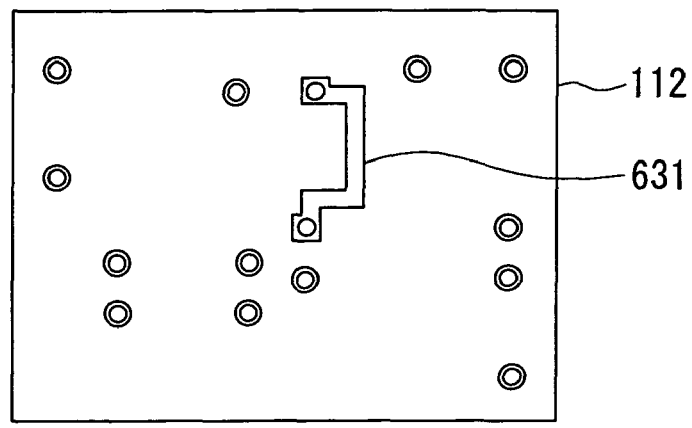
FIG. 6A is a top view showing the top surface of a twelfth dielectric layer of the layered substrate shown in FIG. 2.
Figure 6B:
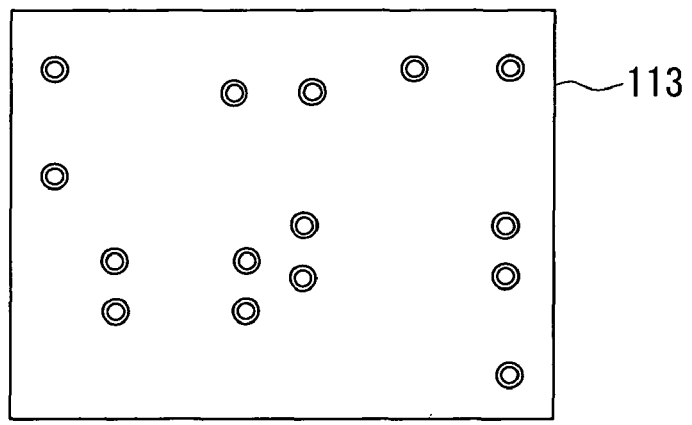
FIG. 6B is a top view showing the top surface of a thirteenth dielectric layer of the layered substrate shown in FIG. 2.
Figure 6C:
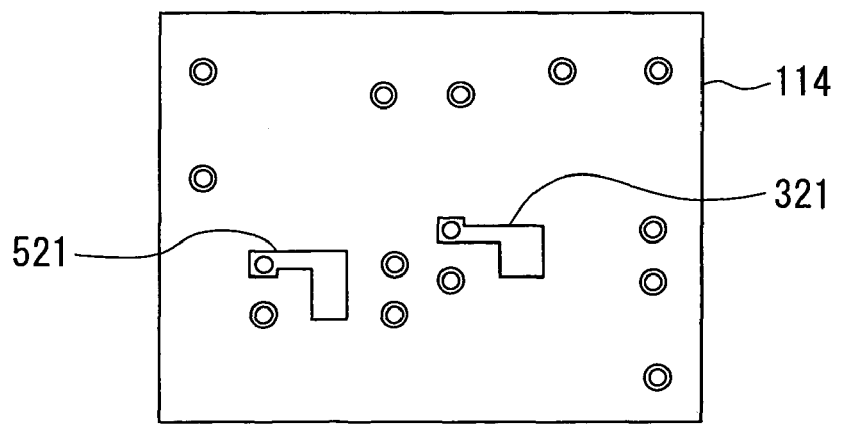
FIG. 6C is a top view showing the top surface of a fourteenth dielectric layer of the layered substrate shown in FIG. 2.
Figure 7A:
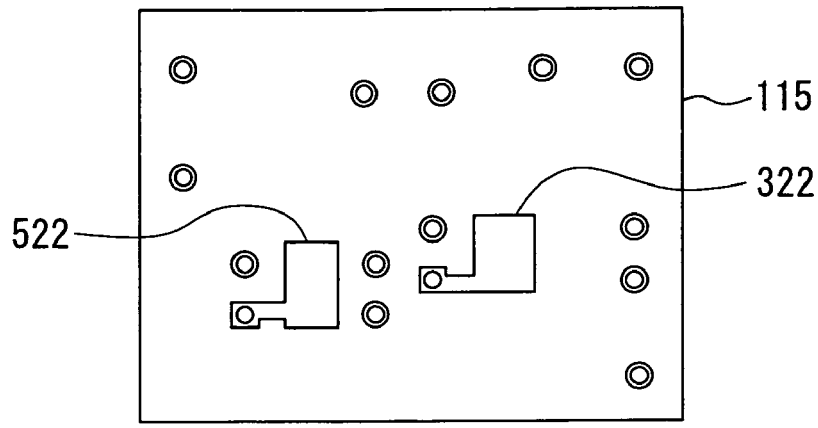
FIG. 7A is a top view showing the top surface of a fifteenth dielectric layer of the layered substrate shown in FIG. 2.
Figure 7B:
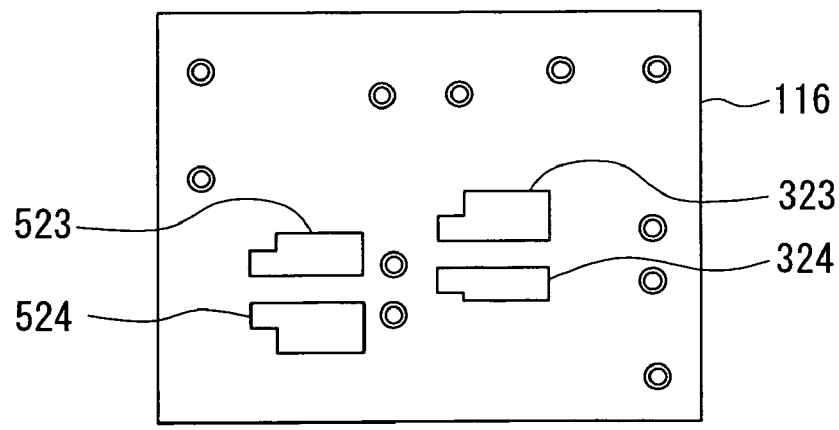
FIG. 7B is a top view showing the top surface of a sixteenth dielectric layer of the layered substrate shown in FIG. 2.
Figure 7C:
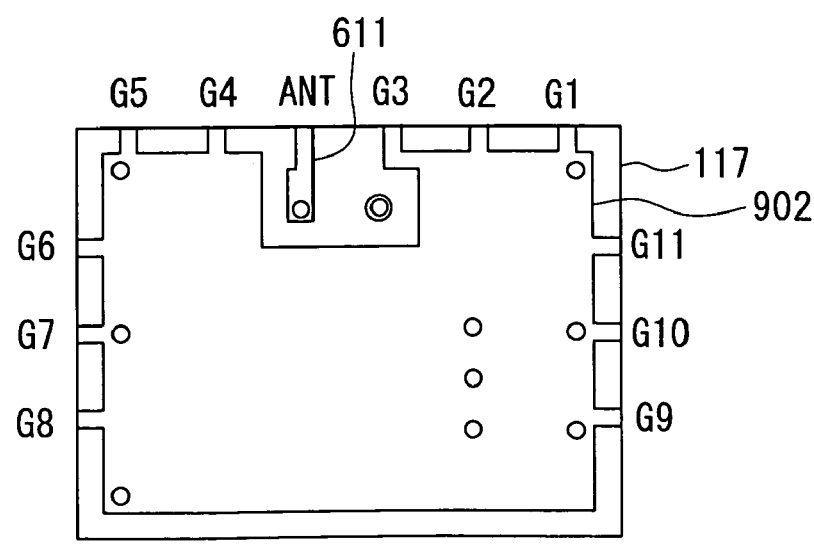
FIG. 7C is a top view showing the top surface of a seventeenth dielectric layer of the layered substrate shown in FIG. 2.
Figure 8A:
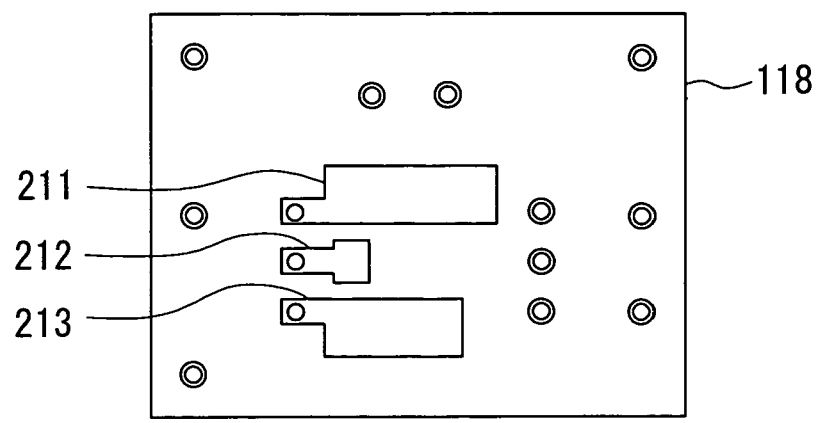
FIG. 8A is a top view showing the top surface of an eighteenth dielectric layer of the layered substrate shown in FIG. 2.
Figure 8B:
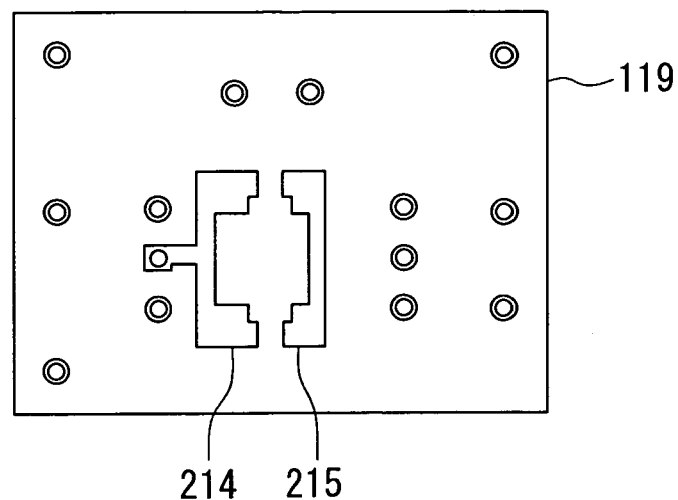
FIG. 8B is a top view showing the top surface of a nineteenth dielectric layer of the layered substrate shown in FIG. 2.
Figure 8C:
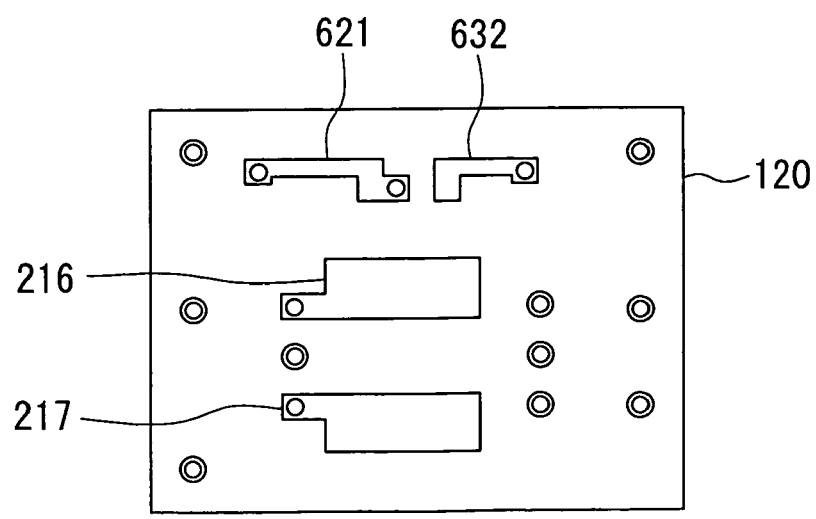
FIG. 8C is a top view showing the top surface of a twentieth dielectric layer of the layered substrate shown in FIG. 2.
Figure 9A:
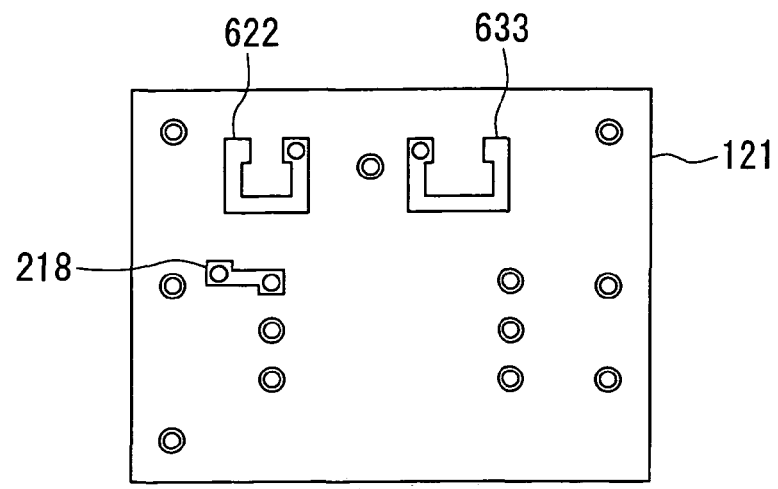
FIG. 9A is a top view showing the top surface of a twenty-first dielectric layer of the layered substrate shown in FIG. 2.
Figure 9B:
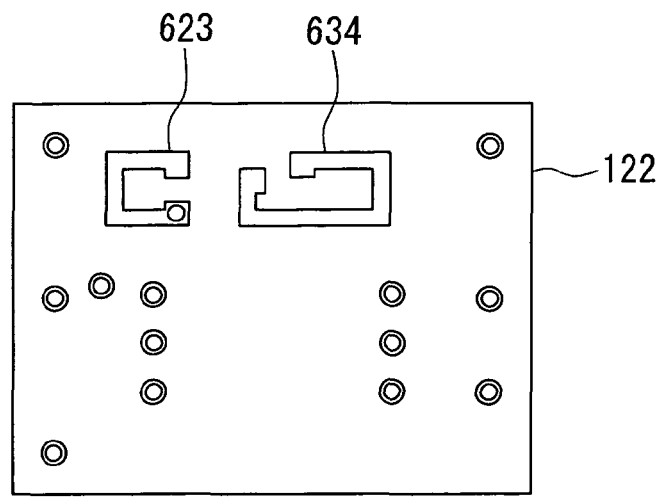
FIG. 9B is a top view showing the top surface of a twenty-second dielectric layer of the layered substrate shown in FIG. 2.
Figure 9C:
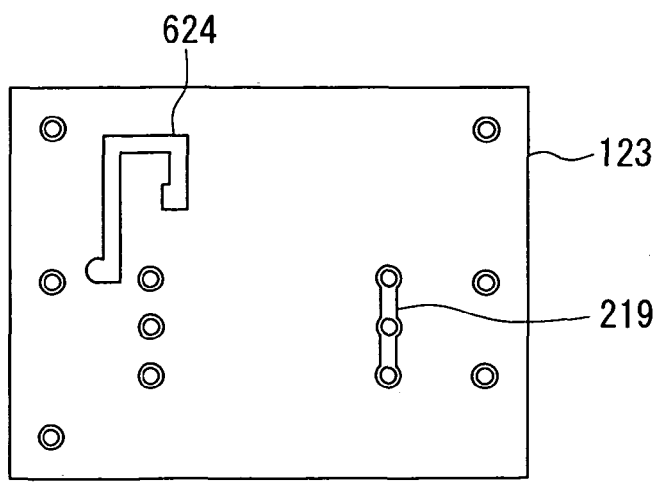
FIG. 9C is a top view showing the top surface of a twenty-third dielectric layer of the layered substrate shown in FIG. 2.
Figure 10A:
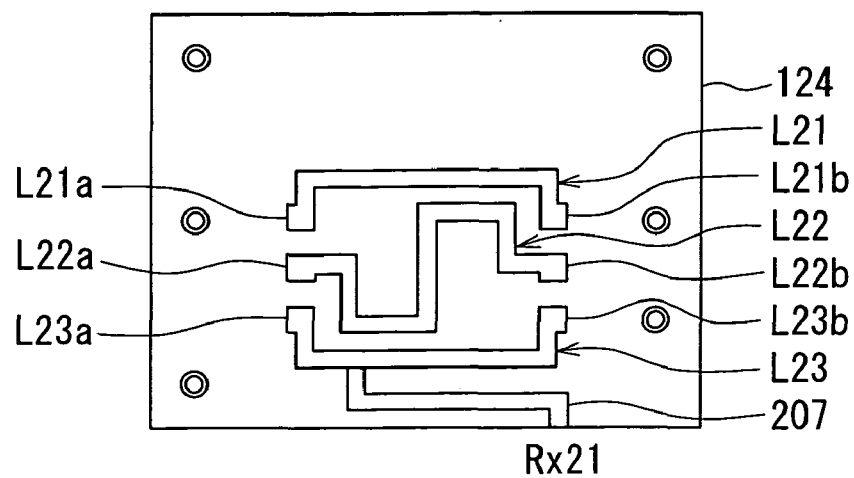
FIG. 10A is a top view showing the top surface of a twenty-fourth dielectric layer of the layered substrate shown in FIG. 2.
Figure 10B:
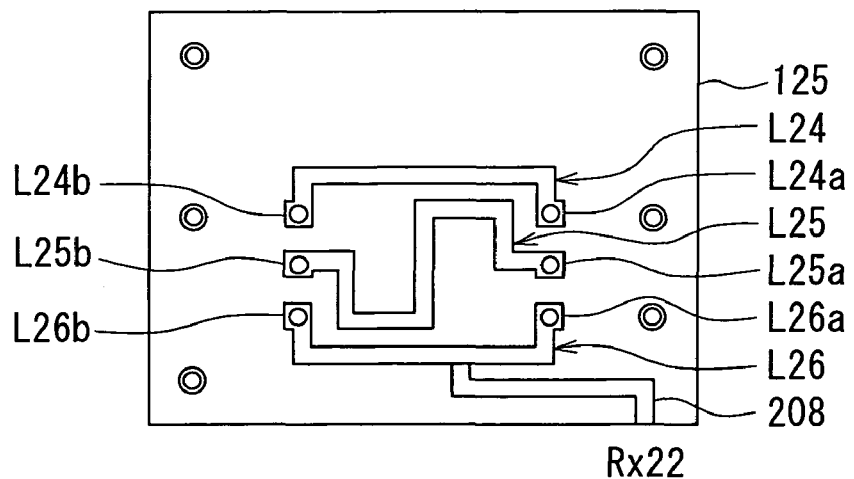
FIG. 10B is a top view showing the top surface of a twenty-fifth dielectric layer of the layered substrate shown in FIG. 2.
Figure 10C:
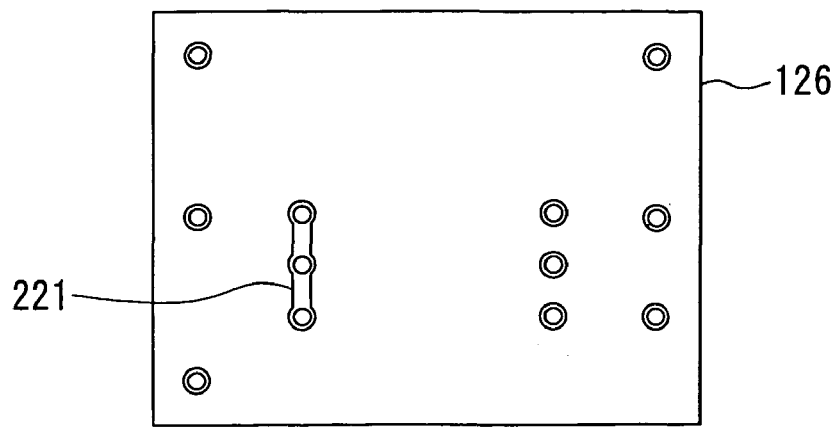
FIG. 10C is a top view showing the top surface of a twenty-sixth dielectric layer of the layered substrate shown in FIG. 2.
Figure 11A:
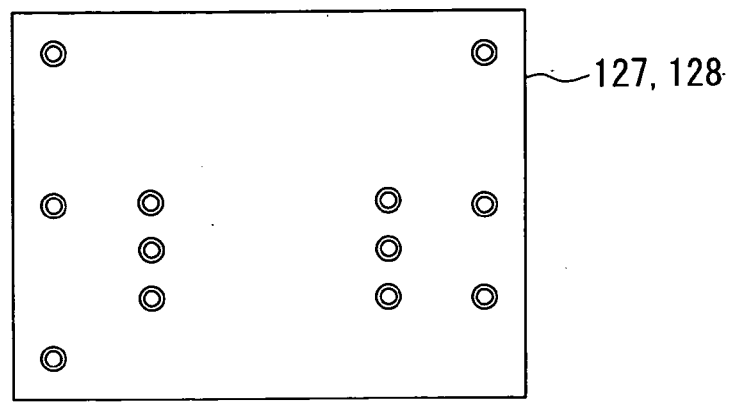
FIG. 11A is a top view showing the top surface of a twenty-seventh and a twenty-eighth dielectric layer of the layered substrate shown in FIG. 2.
Figure 11B:
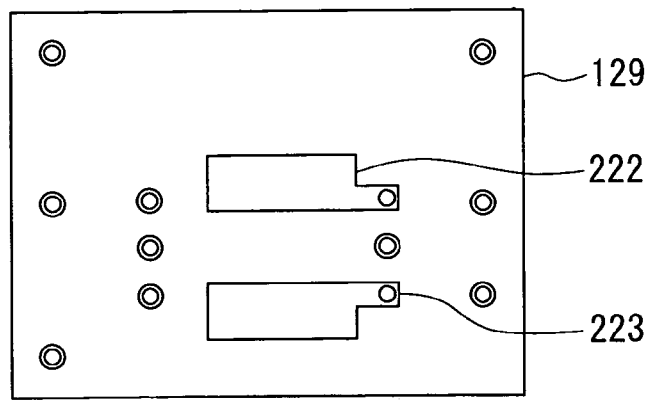
FIG. 11B is a top view showing the top surface of a twenty-ninth dielectric layer of the layered substrate shown in FIG. 2.
Figure 11C:
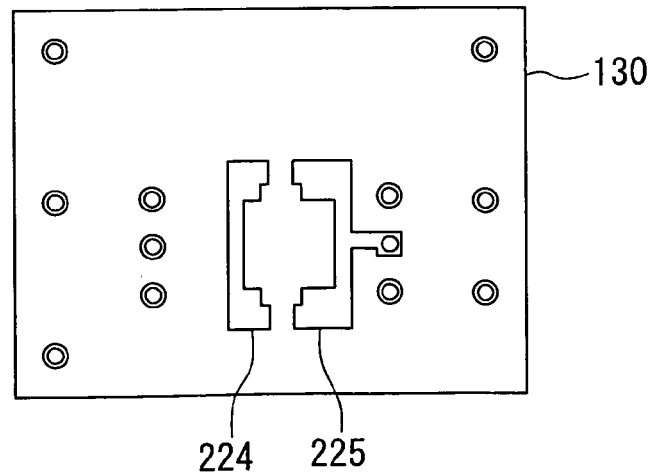
FIG. 11C is a top view showing the top surface of a thirtieth dielectric layer of the layered substrate shown in FIG. 2.
Figure 12A:
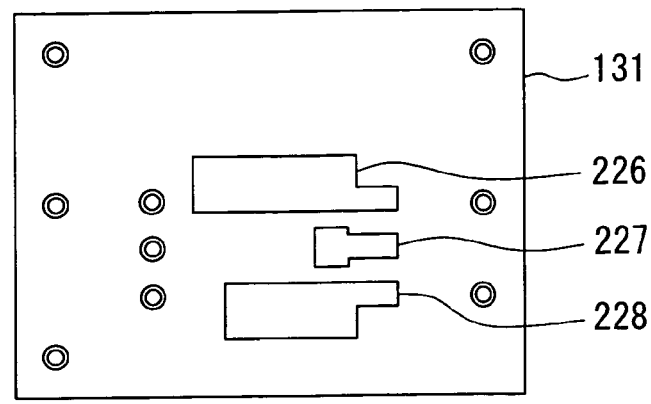
FIG. 12A is a top view showing the top surface of a thirty-first dielectric layer of the layered substrate shown in FIG. 2.
Figure 12B:
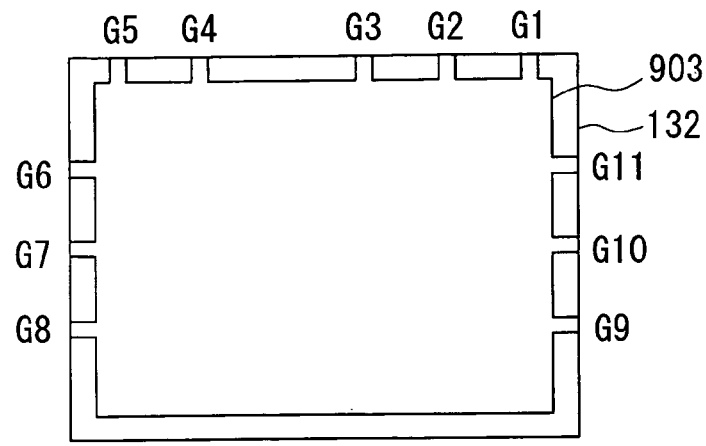
FIG. 12B is a top view showing the top surface of a thirty-second dielectric layer of the layered substrate shown in FIG. 2.
Figure 12C:
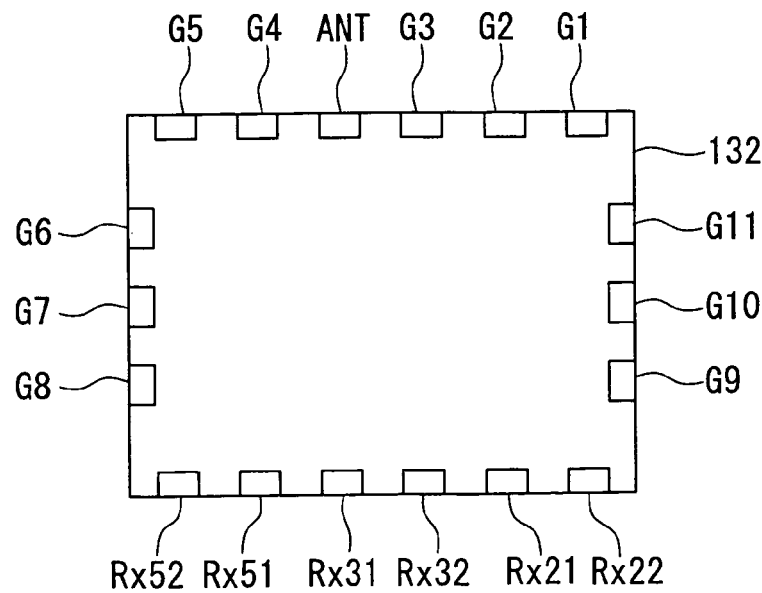
FIG. 12C is a top view showing the thirty-second dielectric layer and a conductor layer therebelow of the layered substrate shown in FIG. 2.

Next, an example of the configuration of the layered substrate 10 will be described with reference to FIG. 3A to FIG. 12C. FIG. 3A shows the top surface of the first dielectric layer from the top. FIG. 3B shows the top surface of the second dielectric layer from the top. FIG. 3C shows the top surface of the third dielectric layer from the top. FIG. 4A shows the top surface of the fourth dielectric layer from the top. FIG. 4B shows the top surface of the fifth dielectric layer from the top. FIG. 4C shows the top surface of the sixth to the eighth dielectric layer from the top. FIG. 5A shows the top surface of the ninth dielectric layer from the top. FIG. 5B shows the top surface of the tenth dielectric layer from the top. FIG. 5C shows the top surface of the eleventh dielectric layer from the top. FIG. 6A shows the top surface of the twelfth dielectric layer from the top. FIG. 6B shows the top surface of the thirteenth dielectric layer from the top. FIG. 6C shows the top surface of the fourteenth dielectric layer from the top. FIG. 7A shows the top surface of the fifteenth dielectric layer from the top. FIG. 7B shows the top surface of the sixteenth dielectric layer from the top. FIG. 7C shows the top surface of the seventeenth dielectric layer from the top. FIG. 8A shows the top surface of the eighteenth dielectric layer from the top. FIG. 8B shows the top surface of the nineteenth dielectric layer from the top. FIG. 8C shows the top surface of the twentieth dielectric layer from the top. FIG. 9A shows the top surface of the twenty-first dielectric layer from the top. FIG. 9B shows the top surface of the twenty-second dielectric layer from the top. FIG. 9C shows the top surface of the twenty-third dielectric layer from the top. FIG. 10A shows the top surface of the twenty-fourth dielectric layer from the top. FIG. 10B shows the top surface of the twenty-fifth dielectric layer from the top. FIG. 10C shows the top surface of the twenty-sixth dielectric layer from the top. FIG. 11A shows the top surface of the twenty-seventh and the twenty-eighth dielectric layer from the top. FIG. 11B shows the top surface of the twenty-ninth dielectric layer from the top. FIG. 11C shows the top surface of the thirtieth dielectric layer from the top. FIG. 12A shows the top surface of the thirty-first dielectric layer from the top. FIG. 12B shows the top surface of the thirty-second dielectric layer from the top. FIG. 12C shows the thirty-second dielectric layer from the top and a conductor layer therebelow as seen from above. The circles in FIG. 3A to FIG. 12C represent through holes.

On the top surface of the first dielectric layer 101 shown in FIG. 3A, i.e., on the top surface 10A of the layered substrate 10, a plurality of conductor layers are formed to constitute the terminals ANT, Rx21, Rx22, Rx31, Rx32, Rx51, Rx52, and G1 to G11.

A ground layer 901 made of a conductor layer is formed on the top surface of the second dielectric layer 102 shown in FIG. 3B. The ground layer 901 is connected to the terminals G1 to G11. The dielectric layer 102 has a plurality of through holes connected to the ground layer 901.

Capacitor conductor layers 311, 312, 511 and 512 are formed on the top surface of the third dielectric layer 103 shown in FIG. 3C. The dielectric layer 103 has four through holes that are connected to the conductor layers 311, 312, 511 and 512, respectively, and a plurality of other through holes.

Capacitor conductor layers 313 and 513 are formed on the top surface of the fourth dielectric layer 104 shown in FIG. 4A. The conductor layer 311 is connected to the conductor layer 313 via a through hole formed in the dielectric layer 103. The conductor layer 511 is connected to the conductor layer 513 via a through hole formed in the dielectric layer 103. The dielectric layer 104 has two through holes that are connected to the conductor layers 313 and 513, respectively, and a plurality of other through holes.

Capacitor conductor layers 314 and 514 are formed on the top surface of the fifth dielectric layer 105 shown in FIG. 4B. The conductor layer 312 is connected to the conductor layer 314 via a plurality of through holes formed in the dielectric layers 103 and 104. The conductor layer 512 is connected to the conductor layer 514 via a plurality of through holes formed in the dielectric layers 103 and 104. The dielectric layer 105 has two through holes that are connected to the conductor layers 314 and 514, respectively, and a plurality of other through holes.

As shown in FIG. 4C, the sixth to eighth dielectric layers 106 to 108 each have a plurality of through holes. The through holes in the dielectric layers 106 to 108 are in the same layout.

On the ninth dielectric layer 109 shown in FIG. 5A, there are formed the resonators L33, L34, L51 and L52 each of which is made of a conductor layer, conductor layers 305 and 505, and a capacitor conductor layer 515. The dielectric layer 109 also has a plurality of through holes.

The resonator L33 has an open end L33a and a short-circuited end L33b. The resonator L34 has an open end L34a and a short-circuited end L34b. The resonator L33 and the resonator L34 are adjacent to each other such that the open ends L33a and L34a are close to each other while the short-circuited ends L33b and L34b are close to each other. Consequently, the resonators L33 and L34 are the same in positional relationship between the open end and the short-circuited end, and the resonators L33 and L34 are combline-coupled to each other.

The resonator L51 has an open end L51a and a short-circuited end L51b. The resonator L52 has an open end L52a and a short-circuited end L52b. The resonator L51 and the resonator L52 are adjacent to each other such that the open ends L51a and L52a are close to each other while the short-circuited ends L51b and L52b are close to each other. Consequently, the resonators L51 and L52 are the same in positional relationship between the open end and the short-circuited end, and the resonators L51 and L52 are combline-coupled to each other.

Each of the resonators L33, L34, L51 and L52 is disposed such that the line connecting the open end to the short-circuited end is in parallel with the sides 10A1 and 10B1 to which the balanced output terminals Rx21, Rx22, Rx31, Rx32, Rx51 and Rx52 are adjacent in the top surface 10A and the bottom surface 10B of the layered substrate 10.

The ground layer 901 is connected to the short-circuited end L33b of the resonator L33 and the short-circuited end L34b of the resonator L34 via a plurality of through holes formed in the dielectric layers 102 to 108. The conductor layers 311 and 313 are connected to the open end L33a of the resonator L33 via a plurality of through holes formed in the dielectric layers 103 to 108. The conductor layers 312 and 314 are connected to the open end L34a of the resonator L34 via a plurality of through holes formed in the dielectric layers 103 to 108. The conductor layer 305 connects the resonator L34 to the terminal Rx32. The conductor layer 305 corresponds to the output port 30c of FIG. 1.

The ground layer 901 is connected to the short-circuited end L51b of the resonator L51 and the short-circuited end L52b of the resonator L52 via a plurality of through holes formed in the dielectric layers 102 to 108. The conductor layers 511 and 513 are connected to the open end L51a of the resonator L51 via a plurality of through holes formed in the dielectric layers 103 to 108. The conductor layers 512 and 514 are connected to the open end L52a of the resonator L52 via a plurality of through holes formed in the dielectric layers 103 to 108. The conductor layer 505 connects the resonator L52 to the terminal Rx51. The conductor layer 505 corresponds to the output port 50b of FIG. 1.

On the top surface of the tenth dielectric layer 110 shown in FIG. 5B, there are formed the resonators L31, L32, L53 and L54 each of which is made of a conductor layer, conductor layers 306 and 506, and a capacitor conductor layer 516.

The resonator L31 has an open end L31a and a short-circuited end L31b. The resonator L32 has an open end L32a and a short-circuited end L32b. The resonator L31 and the resonator L32 are adjacent to each other such that the open ends L31a and L32a are close to each other while the short-circuited ends L31b and L32b are close to each other. Consequently, the resonators L31 and L32 are the same in positional relationship between the open end and the short-circuited end, and the resonators L31 and L32 are combline-coupled to each other.

The resonator L53 has an open end L53a and a short-circuited end L53b. The resonator L54 has an open end L54a and a short-circuited end L54b. The resonator L53 and the resonator L54 are adjacent to each other such that the open ends L53a and L54a are close to each other while the short-circuited ends L53b and L54b are close to each other. Consequently, the resonators L53 and L54 are the same in positional relationship between the open end and the short-circuited end, and the resonators L53 and L54 are combline-coupled to each other.

Each of the resonators L31, L32, L53 and L54 is disposed such that the line connecting the open end to the short-circuited end is in parallel with the sides 10A1 and 10B1 to which the balanced output terminals Rx21, Rx22, Rx31, Rx32, Rx51 and Rx52 are adjacent in the top surface 10A and the bottom surface 10B of the layered substrate 10.

The resonator L31 and the resonator L33 are opposed to each other across the dielectric layer 109 such that the open end L31a and the short-circuited end L33b are close to each other while the short-circuited end L31b and the open end L33a are close to each other. Consequently, the resonators L31 and L33 are opposite in positional relationship between the open end and the short-circuited end, and the resonators L31 and L33 are interdigital-coupled to each other.

The resonator L32 and the resonator L34 are opposed to each other across the dielectric layer 109 such that the open end L32a and the short-circuited end L34b are close to each other while the short-circuited end L32b and the open end L34a are close to each other. Consequently, the resonators L32 and L34 are opposite in positional relationship between the open end and the short-circuited end, and the resonators L32 and L34 are interdigital-coupled to each other.

The resonator L51 and the resonator L53 are opposed to each other across the dielectric layer 109 such that the open end L51a and the short-circuited end L53b are close to each other while the short-circuited end L51b and the open end L53a are close to each other. Consequently, the resonators L51 and L53 are opposite in positional relationship between the open end and the short-circuited end, and the resonators L51 and L53 are interdigital-coupled to each other.

The resonator L52 and the resonator L54 are opposed to each other across the dielectric layer 109 such that the open end L52a and the short-circuited end L54b are close to each other while the short-circuited end L52b and the open end L54a are close to each other. Consequently, the resonators L52 and L54 are opposite in positional relationship between the open end and the short-circuited end, and the resonators L52 and L54 are interdigital-coupled to each other.

The conductor layer 306 connects the resonator L32 to the terminal Rx31. The conductor layer 306 corresponds to the output port 30b of FIG. 1. The conductor layer 506 connects the resonator L54 to the terminal Rx52. The conductor layer 506 corresponds to the output port 50c of FIG. 1. The conductor layer 516 is opposed to the conductor layer 515 across the dielectric layer 109.

The dielectric layer 110 has eight through holes that are connected to the short-circuited ends and open ends of the resonators L31, L32, L53 and L54, respectively, a through hole that is connected to the conductor layer 516, and a plurality of other through holes.

The eleventh dielectric layer 111 shown in FIG. 5C has a plurality of through holes.

A phase line conductor layer 631 is formed on the top surface of the twelfth dielectric layer 112 shown in FIG. 6A. The open end L31a of the resonator L31 is connected to one end of the conductor layer 631 via a plurality of through holes formed in the dielectric layers 110 and 111. The dielectric layer 112 has two through holes that are respectively connected to the one end and the other end of the conductor layer 631, and a plurality of other through holes.

The thirteenth dielectric layer 113 shown in FIG. 6B has a plurality of through holes.

Capacitor conductor layers 321 and 521 are formed on the top surface of the fourteenth dielectric layer 114 shown in FIG. 6C. The open end L31a of the resonator L31 and the one end of the conductor layer 631 are connected to the conductor layer 321 via a plurality of through holes formed in the dielectric layers 110 to 113. The open end L53a of the resonator L53 is connected to the conductor layer 521 via a plurality of through holes formed in the dielectric layers 110 to 113. The dielectric layer 114 has two through holes that are connected to the conductor layers 321 and 521, respectively, and a plurality of other through holes.

Capacitor conductor layers 322 and 522 are formed on the top surface of the fifteenth dielectric layer 115 shown in FIG. 7A. The open end L32a of the resonator L32 is connected to the conductor layer 322 via a plurality of through holes formed in the dielectric layers 110 to 114. The open end L54a of the resonator L54 is connected to the conductor layer 522 via a plurality of through holes formed in the dielectric layers 110 to 114. The dielectric layer 115 has two through holes that are connected to the conductor layers 322 and 522, respectively, and a plurality of other through holes.

Capacitor conductor layers 323, 324, 523 and 524 are formed on the top surface of the sixteenth dielectric layer 116 shown in FIG. 7B. The open end L31a of the resonator L31, the one end of the conductor layer 631, and the conductor layer 321 are connected to the conductor layer 323 via a plurality of through holes formed in the dielectric layers 110 to 115. The open end L32a of the resonator L32 and the conductor layer 322 are connected to the conductor layer 324 via a plurality of through holes formed in the dielectric layers 110 to 115. The open end L53a of the resonator L53 and the conductor layer 521 are connected to the conductor layer 523 via a plurality of through holes formed in the dielectric layers 110 to 115. The open end L54a of the resonator L54 and the conductor layer 522 are connected to the conductor layer 524 via a plurality of through holes formed in the dielectric layers 110 to 115. The dielectric layer 116 also has a plurality of through holes.

A phase line conductor layer 611 and a ground layer 902 are formed on the top surface of the seventeenth dielectric layer 117 shown in FIG. 7C. The ground layer 902 is made of a conductor layer. The conductor layer 611 is connected to the terminal ANT. The conductor layer 516 is connected to the conductor layer 611 via a plurality of through holes formed in the dielectric layers 110 to 116. The ground layer 902 is connected to the terminals G1 to G11. The ground layer 901 and the respective short-circuited ends of the resonators L31, L32, L53 and L54 are connected to the ground layer 902 via a plurality of through holes formed in the dielectric layers 102 to 116. The dielectric layer 117 has a through hole connected to the conductor layer 611, a plurality of through holes connected to the ground layer 902, and another through hole.

Capacitor conductor layers 211, 212 and 213 are formed on the top surface of the eighteenth dielectric layer 118 shown in FIG. 8A. The dielectric layer 118 has three through holes that are connected to the conductor layers 211, 212 and 213, respectively, and a plurality of other through holes.

Capacitor conductor layers 214 and 215 are formed on the top surface of the nineteenth dielectric layer 119 shown in FIG. 8B. The conductor layer 212 is connected to the conductor layer 214 via a through hole formed in the dielectric layer 118. The dielectric layer 119 has a through hole connected to the conductor layer 214, and a plurality of other through holes.

Capacitor conductor layers 216 and 217 and phase line conductor layers 621 and 632 are formed on the top surface of the twentieth dielectric layer 120 shown in FIG. 8C. The conductor layer 211 is connected to the conductor layer 216 via a plurality of through holes formed in the dielectric layers 118 and 119. The conductor layer 213 is connected to the conductor layer 217 via a plurality of through holes formed in the dielectric layers 118 and 119. The conductor layer 611 is connected to the conductor layer 621 via a plurality of through holes formed in the dielectric layers 117 to 119. The conductor layer 631 is connected to the conductor layer 632 via a plurality of through holes formed in the dielectric layers 112 to 120. The dielectric layer 120 has two through holes that are respectively connected to one end and the other end of the conductor layer 621, three through holes that are respectively connected to the conductor layers 216, 217 and 632, and a plurality of other through holes.

A conductor layer 218 and phase line conductor layers 622 and 633 are formed on the top surface of the twenty-first dielectric layer 121 shown in FIG. 9A. The conductor layers 211 and 216 are connected to the conductor layer 218 via a plurality of through holes formed in the dielectric layers 118 to 120. The conductor layer 621 is connected at its one end to the conductor layer 622 via a through hole formed in the dielectric layer 120. The conductor layer 632 is connected to the conductor layer 633 via a through hole formed in the dielectric layer 120. The dielectric layer 121 has two through holes that are respectively connected to one end and the other end of the conductor layer 218, two through holes that are respectively connected to the conductor layers 622 and 633, and a plurality of other through holes.

Phase line conductor layers 623 and 634 are formed on the top surface of the twenty-second dielectric layer 122 shown in FIG. 9B. The conductor layer 622 is connected to the conductor layer 623 via a through hole formed in the dielectric layer 121. The conductor layer 633 is connected to one end of the conductor layer 634 via a through hole formed in the dielectric layer 121. The other end of the conductor layer 621 is connected to the other end of the conductor layer 634 via a plurality of through holes formed in the dielectric layers 120 and 121. The dielectric layer 122 has a through hole connected to the conductor layer 623, and a plurality of other through holes.

A conductor layer 219 and a phase line conductor layer 624 are formed on the top surface of the twenty-third dielectric layer 123 shown in FIG. 9C. The ground layer 902 is connected to the conductor layer 219 via a plurality of through holes formed in the dielectric layers 117 to 122. The conductor layer 623 is connected to one end of the conductor layer 624 via a through hole formed in the dielectric layer 122. The conductor layer 218 is connected to the other end of the conductor layer 624 via a plurality of through holes formed in the dielectric layers 121 and 122. The dielectric layer 123 has three through holes connected to the conductor layer 219, and a plurality of other through holes.

The resonators L21, L22 and L23 and a conductor layer 207 are formed on the top surface of the twenty-fourth dielectric layer 124 shown in FIG. 10A. Each of the resonators L21, L22 and L23 is made of a conductor layer. The resonator L21 has an open end L21a and a short-circuited end L21b. The resonator L22 has an open end L22a and a short-circuited end L22b. The resonator L23 has an open end L23a and a short-circuited end L23b. The resonator L21 and the resonator L22 are adjacent to each other such that the open ends L21a and L22a are close to each other while the short-circuited ends L21b and L22b are close to each other. Consequently, the resonators L21 and L22 are the same in positional relationship between the open end and the short-circuited end, and the resonators L21 and L22 are combline-coupled to each other. The resonator L22 and the resonator L23 are adjacent to each other such that the open ends L22a and L23a are close to each other while the short-circuited ends L22b and L23b are close to each other. Consequently, the resonators L22 and L23 are the same in positional relationship between the open end and the short-circuited end, and the resonators L22 and L23 are combline-coupled to each other.

Each of the resonators L21, L22 and L23 is disposed such that the line connecting the open end to the short-circuited end is in parallel with the sides 10A1 and 10B1 to which the balanced output terminals Rx21, Rx22, Rx31, Rx32, Rx51 and Rx52 are adjacent in the top surface 10A and bottom surface 10B of the layered substrate 10.

The conductor layers 211, 216, and 218 are connected to the open end L21a of the resonator L21 via a plurality of through holes formed in the dielectric layers 118 to 123. The conductor layers 212 and 214 are connected to the open end L22a of the resonator L22 via a plurality of through holes formed in the dielectric layers 118 to 123. The conductor layers 213 and 217 are connected to the open end L23a of the resonator L23 via a plurality of through holes formed in the dielectric layers 118 to 123. The ground layer 902 and the conductor layer 219 are connected to the respective short-circuited ends L21b, L22b and L23b of the resonators L21, L22 and L23 via a plurality of through holes formed in the dielectric layers 117 to 123.

The conductor layer 207 connects the resonator L23 to the terminal Rx21. The conductor layer 207 corresponds to the output port 20b of FIG. 1. The dielectric layer 124 also has a plurality of through holes.

The resonators L24, L25 and L26 and a conductor layer 208 are formed on the top surface of the twenty-fifth dielectric layer 125 shown in FIG. 10B. Each of the resonators L24, L25 and L26 is made of a conductor layer. The resonator L24 has an open end L24a and a short-circuited end L24b. The resonator L25 has an open end L25a and a short-circuited end L25b. The resonator L26 has an open end L26a and a short-circuited end L26b. The resonator L24 and the resonator L25 are adjacent to each other such that the open ends L24a and L25a are close to each other while the short-circuited ends L24b and L25b are close to each other. Consequently, the resonators L24 and L25 are the same in positional relationship between the open end and the short-circuited end, and the resonators L24 and L25 are combline-coupled to each other. The resonator L25 and the resonator L26 are adjacent to each other such that the open ends L25a and L26a are close to each other while the short-circuited ends L25b and L26b are close to each other. Consequently, the resonators L25 and L26 are the same in positional relationship between the open end and the short-circuited end, and the resonators L25 and L26 are combline-coupled to each other.

Each of the resonators L24, L25 and L26 is disposed such that the line connecting the open end to the short-circuited end is in parallel with the sides 10A1 and 10B1 to which the balanced output terminals Rx21, Rx22, Rx31, Rx32, Rx51 and Rx52 are adjacent in the top surface 10A and bottom surface 10B of the layered substrate 10.

The resonator L21 and the resonator L24 are opposed to each other across the dielectric layer 124 such that the open end L21a and the short-circuited end L24b are close to each other while the short-circuited end L21b and the open end L24a are close to each other. Consequently, the resonators L21 and L24 are opposite in positional relationship between the open end and the short-circuited end, and the resonators L21 and L24 are interdigital-coupled to each other.

The resonator L22 and the resonator L25 are opposed to each other across the dielectric layer 124 such that the open end L22a and the short-circuited end L25b are close to each other while the short-circuited end L22b and the open end L25a are close to each other. Consequently, the resonators L22 and L25 are opposite in positional relationship between the open end and the short-circuited end, and the resonators L22 and L25 are interdigital-coupled to each other.

The resonator L23 and the resonator L26 are opposed to each other across the dielectric layer 124 such that the open end L23a and the short-circuited end L26b are close to each other while the short-circuited end L23b and the open end L26a are close to each other. Consequently, the resonators L23 and L26 are opposite in positional relationship between the open end and the short-circuited end, and the resonators L23 and L26 are interdigital-coupled to each other.

The conductor layer 208 connects the resonator L26 to the terminal Rx22. The conductor layer 208 corresponds to the output port 20c of FIG. 1. The dielectric layer 125 has six through holes that are connected to the respective short-circuited ends and the respective open ends of the resonators L24, L25 and L26, and a plurality of other through holes.

A conductor layer 221 is formed on the top surface of the twenty-sixth dielectric layer 126 shown in FIG. 10C. The short-circuited ends L24b, L25b and L26b of the resonators L24, L25 and L26 are connected to the conductor layer 221 via three through holes formed in the dielectric layer 125. The dielectric layer 126 has three through holes connected to the conductor layer 221, and a plurality of other through holes.

As shown in FIG. 11A, the twenty-seventh and twenty-eighth dielectric layers 127 and 128 each have a plurality of through holes. The through holes of the dielectric layers 127 and 128 are in the same layout.

Capacitor conductor layers 222 and 223 are formed on the top surface of the twenty-ninth dielectric layer 129 shown in FIG. 11B. The open end L24a of the resonator L24 is connected to the conductor layer 222 via a plurality of through holes formed in the dielectric layers 125 to 128. The open end L26a of the resonator L26 is connected to the conductor layer 223 via a plurality of through holes formed in the dielectric layers 125 to 128. The dielectric layer 129 has two through holes that are connected to the conductor layers 222 and 223, respectively, and a plurality of other through holes.

Capacitor conductor layers 224 and 225 are formed on the top surface of the thirtieth dielectric layer 130 shown in FIG. 11C. The open end L25a of the resonator L25 is connected to the conductor layer 225 via a plurality of through holes formed in the dielectric layers 125 to 129. The dielectric layer 130 has a through hole connected to the conductor layer 225, and a plurality of other through holes.

Capacitor conductor layers 226, 227 and 228 are formed on the top surface of the thirty-first dielectric layer 131 shown in FIG. 12A. The open end L24a of the resonator L24 and the conductor layer 222 are connected to the conductor layer 226 via a plurality of through holes formed in the dielectric layers 125 to 130. The open end L25a of the resonator L25 and the conductor layer 225 are connected to the conductor layer 227 via a plurality of through holes formed in the dielectric layers 125 to 130. The open end L26a of the resonator L26 and the conductor layer 223 are connected to the conductor layer 228 via a plurality of through holes formed in the dielectric layers 125 to 130. The dielectric layer 131 also has a plurality of through holes.

A ground layer 903 made of a conductor layer is formed on the top surface of the thirty-second dielectric layer 132 shown in FIG. 12B. The ground layer 903 is connected to the terminals G1 to G11. The ground layer 902, the short-circuited ends L24b, L25b and L26b of the resonators L24, L25 and L26, and the conductor layer 221 are connected to the conductor layer 903 via a plurality of through holes formed in the dielectric layers 117 to 131.

As shown in FIG. 12C, conductor layers to constitute the terminals ANT, Rx21, Rx22, Rx31, Rx32, Rx51, Rx52, and G1 to G11 are formed at the bottom surface of the dielectric layer 132, i.e., at the bottom surface 10B of the layered substrate 10.

The layered substrate 10 shown in FIG. 2 is formed by stacking the dielectric layers 101 to 132 and the plurality of conductor layers shown in FIG. 3A to FIG. 12C into a laminate, and then forming, on the laminate, the portions of the plurality of terminals shown in FIG. 2 to be arranged on the side surfaces 10C, 10D, 10E and 10F.

The dielectric layers 101 to 132 may be made of various types of materials including resins, ceramics, and composite materials of these. In particular, for a better high frequency characteristic, the layered substrate 10 is preferably such one that the dielectric layers 101 to 132 are formed of ceramic by a low-temperature co-firing method.

The filter 20 shown in FIG. 1 is composed of the resonators L21, L22, L23, L24, L25 and L26, the conductor layers 207, 208, 211 to 219 and 221 to 228, the ground layers 902 and 903, the dielectric layers 117 to 131, and a plurality of through holes formed in the dielectric layers 117 to 131.

The conductor layer 211, the ground layer 902, and the dielectric layer 117 interposed therebetween constitute the capacitor C21. The conductor layer 212, the ground layer 902, and the dielectric layer 117 interposed therebetween constitute the capacitor C22. The conductor layer 213, the ground layer 902, and the dielectric layer 117 interposed therebetween constitute the capacitor C23.

The conductor layers 211 and 214 and the dielectric layer 118 interposed therebetween, and the conductor layers 214 and 216 and the dielectric layer 119 interposed therebetween, constitute the capacitor C41. The conductor layers 213 and 214 and the dielectric layer 118 interposed therebetween, and the conductor layers 214 and 217 and the dielectric layer 119 interposed therebetween, constitute the capacitor C42. The conductor layers 211, 213 and 215 and the dielectric layer 118 interposed therebetween, and the conductor layers 215, 216 and 217 and the dielectric layer 119 interposed therebetween, constitute the capacitor C43.

The conductor layer 226, the ground layer 903, and the dielectric layer 131 interposed therebetween constitute the capacitor C24. The conductor layer 227, the ground layer 903, and the dielectric layer 131 interposed therebetween constitute the capacitor C25. The conductor layer 226, the ground layer 903, and the dielectric layer 131 interposed therebetween constitute the capacitor C26.

The conductor layers 222 and 225 and the dielectric layer 129 interposed therebetween, and the conductor layers 225 and 226 and the dielectric layer 130 interposed therebetween, constitute the capacitor C44. The conductor layers 223 and 225 and the dielectric layer 129 interposed therebetween, and the conductor layers 225 and 228 and the dielectric layer 130 interposed therebetween, constitute the capacitor C45. The conductor layers 222, 223 and 224 and the dielectric layer 129 interposed therebetween, and the conductor layers 224, 226 and 228 and the dielectric layer 130 interposed therebetween, constitute the capacitor C46.

The filter 30 shown in FIG. 1 is composed of the resonators L31, L32, L33 and L34, the conductor layers 305, 306, 311 to 314 and 321 to 324, the ground layers 901 and 902, the dielectric layers 102 to 116, and a plurality of through holes formed in the dielectric layers 102 to 116.

The conductor layer 323, the ground layer 902, and the dielectric layer 116 interposed therebetween constitute the capacitor C31. The conductor layer 324, the ground layer 902, and the dielectric layer 116 interposed therebetween constitute the capacitor C32. The conductor layers 321 and 322, and the dielectric layer 114 interposed therebetween constitute the capacitor C35.

The conductor layer 311, the ground layer 901, and the dielectric layer 102 interposed therebetween constitute the capacitor C33. The conductor layer 312, the ground layer 901, and the dielectric layer 102 interposed therebetween constitute the capacitor C34. The conductor layers 313 and 314, and the dielectric layer 104 interposed therebetween constitute the capacitor C36.

The filter 50 shown in FIG. 1 is composed of the resonators L51, L52, L53 and L54, the conductor layers 505, 506, 511 to 516 and 521 to 524, the ground layers 901 and 902, the dielectric layers 102 to 116, and a plurality of through holes formed in the dielectric layers 102 to 116.

The conductor layer 511, the ground layer 901, and the dielectric layer 102 interposed therebetween constitute the capacitor C51. The conductor layer 512, the ground layer 901, and the dielectric layer 102 interposed therebetween constitute the capacitor C52. The conductor layers 513 and 514, and the dielectric layer 104 interposed therebetween constitute the capacitor C55.

The conductor layer 523, the ground layer 902, and the dielectric layer 116 interposed therebetween constitute the capacitor C53. The conductor layer 524, the ground layer 902, and the dielectric layer 116 interposed therebetween constitute the capacitor C54. The conductor layers 521 and 522, and the dielectric layer 114 interposed therebetween constitute the capacitor C56.

The capacitor C57 shown in FIG. 1 is composed of the conductor layers 515 and 516 and the dielectric layer 109 interposed therebetween.

The phase line 61 shown in FIG. 1 is composed of the conductor layer 611. The phase line 62 shown in FIG. 1 is composed of the conductor layers 621 to 624 and the through holes connecting these conductor layers. The phase line 63 shown in FIG. 1 is composed of the conductor layers 631 to 634 and the through holes connecting these conductor layers.

The conductor layer 611 constituting the phase line 61 is connected to the input terminal ANT. The conductor layer 611 is also connected, via through holes, to the conductor layer 621 that constitutes the phase line 62. The conductor layer 611 is also connected, via the conductor layer 621 and through holes, to the conductor layer 634 that constitutes the phase line 63. The conductor layer 611 is further connected, via through holes, to the conductor layer 516 that constitutes a part of the capacitor C57.

The conductor layer 624 constituting the phase line 62 is connected to the resonator L21 of the filter 20 via the conductor layer 218 and through holes. The conductor layer 624 is also connected to the conductor layers 211 and 216 that constitute portions of the capacitors C21, C41 and C43 of the filter 20. The conductor layer 631 constituting the phase line 63 is connected to the resonator L31 of the filter 30 via through holes. The conductor layer 631 is also connected to the conductor layers 321 and 323 that constitute portions of the capacitors C31 and C35 of the filter 30.

A description will now be given of the effect of the triplexer 1 according to the present embodiment. The triplexer 1 according to the present embodiment is capable of separating three signals of different frequency bands inputted to the input terminal ANT, and outputting them as balanced signals from the respective corresponding balanced output terminals. In a wireless communication apparatus that includes a triplexer and signal processing circuitry (such as a single integrated circuit) provided in the subsequent stage of the triplexer and receiving three reception signals each in the form of a balanced signal, the use of the triplexer 1 according to the present embodiment eliminates the need for providing three baluns between the triplexer 1 and the signal processing circuitry. This allows miniaturization of the wireless communication apparatus.

In the present embodiment, each of the filters 20, 30 and 50 has a pair of output resonators interdigital-coupled to each other. This makes it possible for the triplexer 1 to output the first to third balanced signals without any baluns in the triplexer 1. All of the filters 20, 30 and 50 are formed within the layered substrate 10. According to the present embodiment, it is therefore possible to achieve miniaturization of the balanced-output triplexer 1.

According to the present embodiment, since each of the filters 20, 30 and 50 has a pair of output resonators interdigital-coupled to each other, it is also possible to achieve miniaturization of the resonators as previously described. Miniaturization of the balanced-output triplexer 1 is possible from this respect, too.

In the present embodiment, all the balanced output terminals Rx21, Rx22, Rx31, Rx32, Rx51 and Rx52 are arranged to be adjacent to the side 10A1, which is formed of the ridge between the top surface 10A and the side surface 10C, and adjacent to the side 10B1, which is formed of the ridge between the bottom surface 10B and the side surface 10C. The balanced output terminals Rx21, Rx22, Rx31, Rx32, Rx51 and Rx52 may also be arranged to be adjacent to either one of the sides 10A1 and 10B1 only. The balanced output terminals are connected to the respective corresponding balanced input terminals of signal processing circuitry (such as a single integrated circuit) for processing the first to third balanced signals outputted from the triplexer 1. According to the present embodiment, since all the balanced output terminals are arranged to be adjacent to one side, it is easy to connect all the balanced output terminals to the corresponding plurality of balanced input terminals of the signal processing circuitry. Moreover, according to the present embodiment, it is possible to connect all the balanced output terminals to the corresponding plurality of balanced input terminals of the signal processing circuitry via respective short signal paths, and it is also possible to suppress variations in length among the plurality of signal paths. For example, suppose that the plurality of balanced input terminals of the signal processing circuitry corresponding to the plurality of balanced output terminals of the triplexer 1 are arranged in a row in the same order as the plurality of balanced output terminals are. In this case, the plurality of balanced output terminals and the plurality of corresponding balanced input terminals can be opposed to each other and connected to each other via extremely short signal paths. From the foregoing, the present embodiment makes it possible to prevent a drop in the levels of the balanced signals and degradation of the balance characteristics thereof.

Figure 13:
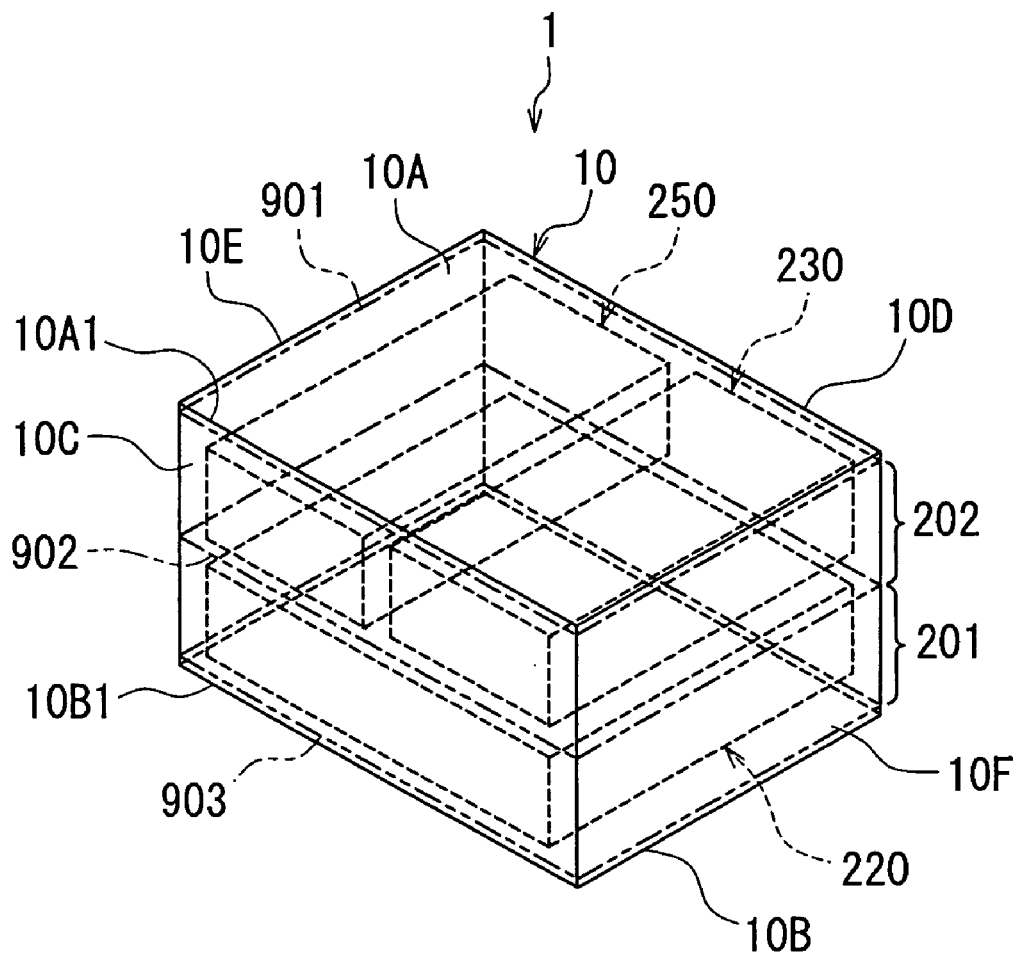
FIG. 13 is a simplified perspective view showing the layout of first to third filters in the balanced-output triplexer according to the embodiment of the present invention.

Reference is now made to FIG. 13 to describe the features of the layout of the first to third filters 20, 30 and 50 in the layered substrate 10 according to the present embodiment. FIG. 13 is a simplified perspective view showing the layout of the filters 20, 30 and 50 in the layered substrate 10. The layered substrate 10 has the three ground layers 901, 902 and 903. All the ground layers 901, 902 and 903 are connected to the ground terminals G1 to G11, and are connected to an external ground through these ground terminals G1 to G11. The ground layer 901 is disposed near the top surface 10A of the layered substrate 10. The ground layer 903 is disposed near the bottom surface 10B of the layered substrate 10. The ground layer 902 is disposed within the layered substrate 10, between the ground layers 901 and 903. As a result, as shown in FIG. 13, a first area 201 and a second area 202 sandwiching the ground layer 902 are created in the layered substrate 10. The first area 201 lies between the ground layer 902 and the ground layer 903. The second area 202 lies between the ground layer 901 and the ground layer 902.

The first filter 20 is disposed in the first area 201. The second filter 30 and the third filter 50 are disposed in the second area 202. In FIG. 13, the three areas designated by reference numerals 220, 230 and 250 represent the areas where the filters 20, 30 and 50 are disposed, respectively. The second filter 30 and the third filter 50 are disposed in the separate areas 230 and 250, which are horizontally adjacent areas in the second area 202.

Such a layout that the first filter 20 is disposed in the first area 201 while the second and third filters 30 and 50 are disposed in the second area 202 as described above provides the following advantages. When the filters 20, 30 and 50 are each composed of a plurality of resonators as in the present embodiment, filters of lower pass bands require resonators of larger sizes. It is the filter 20 among the filters 20, 30 and 50 that requires the largest resonators. The entire size of the filter 20 is also the largest accordingly. Here, the filter 20 of the largest size is disposed in one area 201 while the other two filters 30 and 50 of smaller sizes than the filter 20 are disposed in the other area 202. This makes it possible to make effective use of the space inside the layered substrate 10, consequently allowing miniaturization of the layered substrate 10.

In the present embodiment, as shown in FIG. 13, the three areas 220, 230 and 250 in which the filters 20, 30 and 50 are respectively disposed are positioned so as not to overlap each other when seen in the direction perpendicular to the side surface 10C. In other words, none of the three areas 220, 230 and 250 is interposed in part or in whole between any other of the three areas and the side surface 10C. According to the present embodiment, it is therefore possible to easily dispose all the balanced output terminals Rx21, Rx22, Rx31, Rx32, Rx51 and Rx52 such that they are adjacent to the side 10A1, which is formed of the ridge between the top surface 10A and the side surface 10C, and adjacent to the side 10B1, which is formed of the ridge between the bottom surface 10B and the side surface 10C. The present embodiment also makes it possible to reduce all the signal paths in length between the filters and the respective corresponding pairs of balanced output terminals. Consequently, according to the present embodiment, it is possible to prevent a drop in the levels of the first to third balanced signals and degradation of the balance characteristics thereof.

According to the present embodiment, in each of the top and bottom surfaces 10A and 10B, all the balanced output terminals Rx21, Rx22, Rx31, Rx32, Rx51 and Rx52 are disposed to be adjacent to one side (the side 10A1 or the side 10B1). In this case, if one or more other terminals than the balanced output terminals are also adjacent to the side to which all the balanced output terminals are adjacent, then it becomes necessary to increase that side in length. This consequently makes it difficult to reduce the triplexer 1 in size. According to the present embodiment, in each of the top and bottom surfaces 10A and 10B, all the terminals except the balanced output terminals are disposed to be adjacent to any of the sides other than the side to which all the balanced output terminals are adjacent. The present embodiment thus makes it possible to reduce the balanced-output triplexer 1 in size. It should be appreciated that the triplexer 1 is originally designed so that the first to third balanced output terminals are widely isolated from each other. There is thus little necessity to increase the distances between the first to third balanced output terminals by, for example, providing ground terminals between the first to third balanced output terminals.

In the present embodiment, the pair of output resonators of each of the filters 20, 30 and 50 are arranged so that the line connecting the open end to the short-circuited end in each of the resonators is in parallel with the sides 10A1 and 10B1 to which the first to third balanced output terminals are adjacent. According to the present embodiment, it is thus possible to make the whole of each output resonator be close to the corresponding balanced output terminal. This consequently facilitates connecting the output resonators to the corresponding balanced output terminals.

A practical example of the triplexer 1 according to the present embodiment will now be described. In this practical example, the first filter 20 was designed to have a pass band of 2.3 to 2.69 GHz, the second filter 30 was designed to have a pass band of 3.4 to 3.8 GHz, and the third filter 50 was designed to have a pass band of 5.15 to 5.875 GHz. The characteristics of the triplexer 1 of this practical example will be described below.

Figure 14:
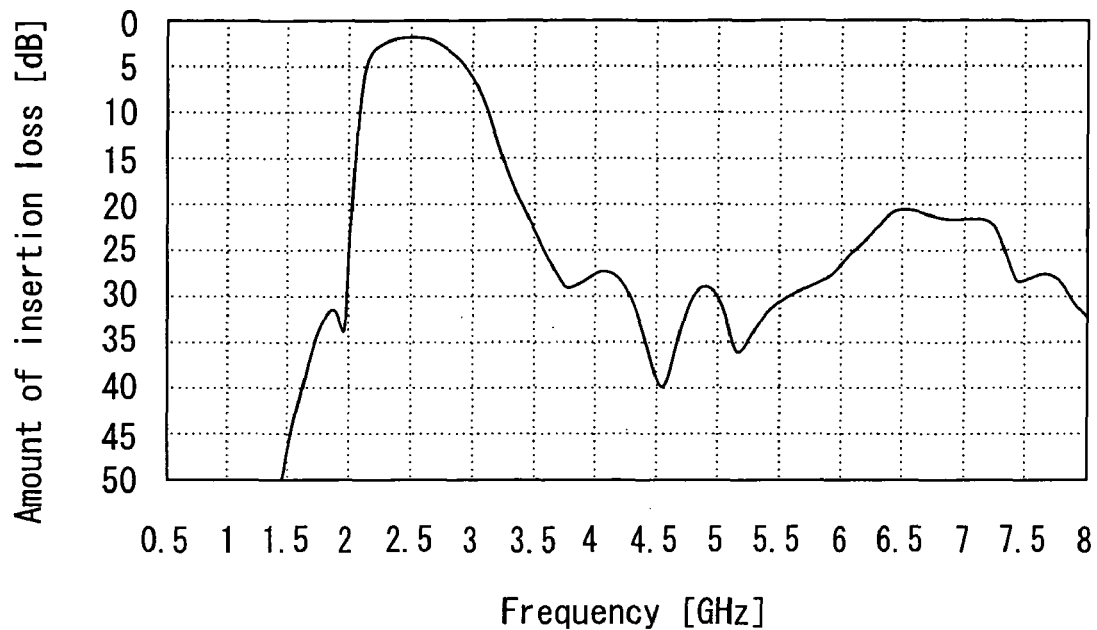
FIG. 14 is a characteristic chart showing the insertion loss characteristic of a signal path between an input terminal and first balanced output terminals of a triplexer of a practical example.
Figure 15:
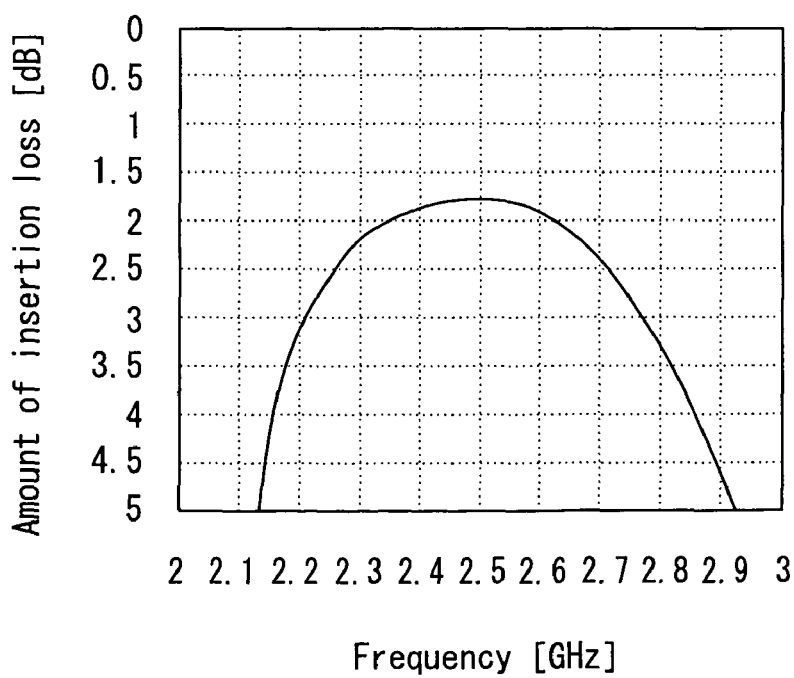
FIG. 15 is a magnified characteristic chart showing a part of the characteristic chart of FIG. 14.
Figure 16:
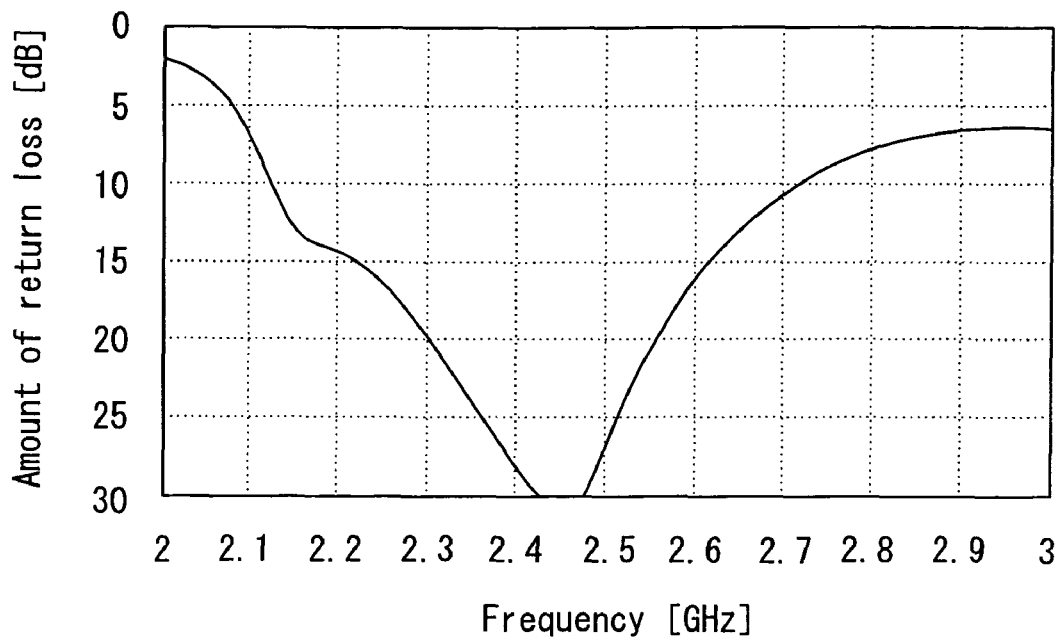
FIG. 16 is a characteristic chart showing a return loss characteristic at the input terminal of the triplexer of the practical example in a frequency range that covers the pass band of the first filter.
Figure 17:
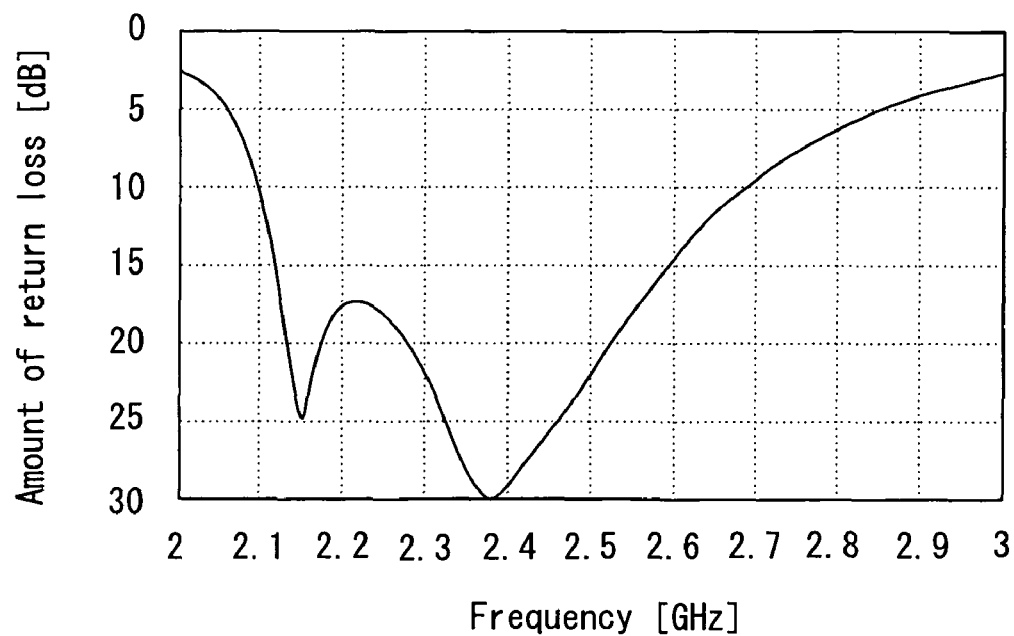
FIG. 17 is a characteristic chart showing a return loss characteristic at the first balanced output terminals of the triplexer of the practical example.
Figure 18:
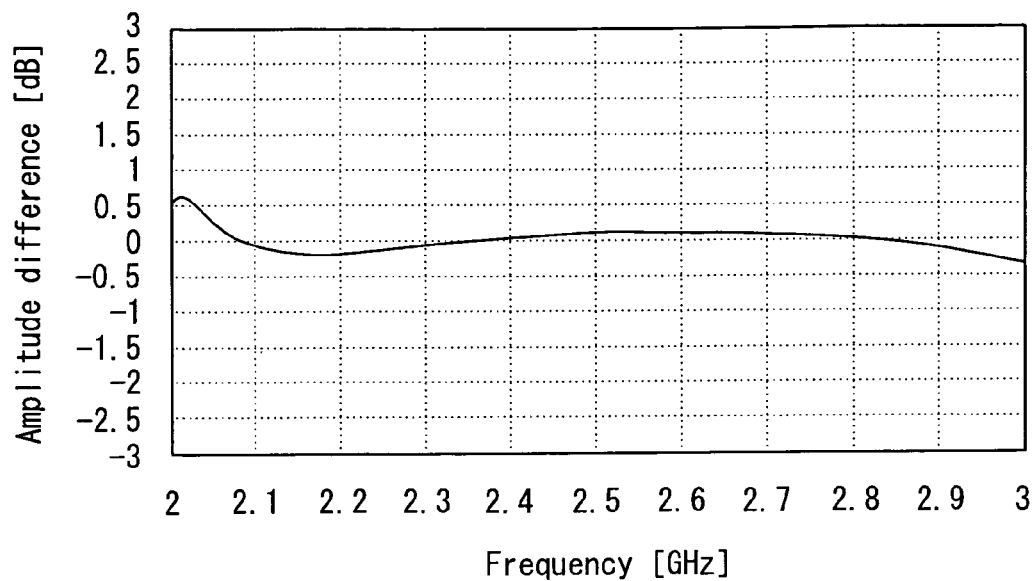
FIG. 18 is a characteristic chart showing the frequency characteristic of an amplitude difference between the output signals of the first balanced output terminals of the triplexer of the practical example.
Figure 19:
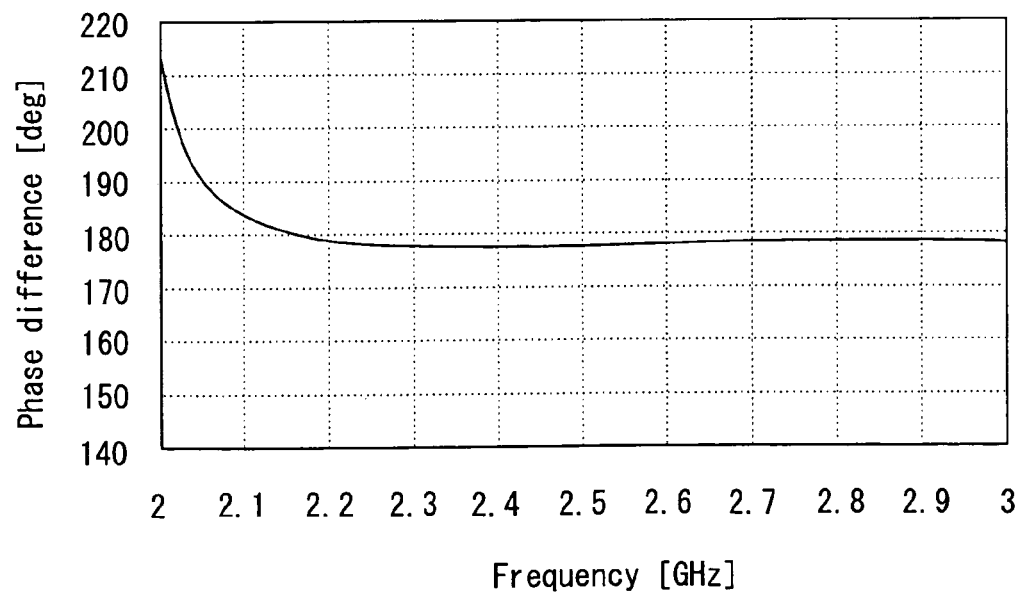
FIG. 19 is a characteristic chart showing the frequency characteristic of a phase difference between the output signals of the first balanced output terminals of the triplexer of the practical example.

Reference is made to FIG. 14 to FIG. 19 to describe the characteristics of the signal path between the input terminal ANT and the first balanced output terminals Rx21 and Rx22 of the triplexer 1 according to the practical example. FIG. 14 shows the insertion loss characteristic of the signal path between the input terminal ANT and the first balanced output terminals Rx21 and Rx22. FIG. 15 is an enlarged view of a part of FIG. 14. FIG. 16 shows a return loss characteristic at the input terminal ANT in a frequency range that covers the pass band of the first filter 20. FIG. 17 shows a return loss characteristic at the first balanced output terminals Rx21 and Rx22. FIG. 18 shows the frequency characteristic of an amplitude difference between the output signals of the first balanced output terminals Rx21 and Rx22. FIG. 19 shows the frequency characteristic of a phase difference between the output signals of the first balanced output terminals Rx21 and Rx22. In FIG. 14 to FIG. 19, the horizontal axis indicates the frequency. In FIG. 14 and FIG. 15, the vertical axis indicates the amount of insertion loss. In FIG. 16 and FIG. 17, the vertical axis indicates the amount of return loss. In FIG. 18, the vertical axis indicates the amplitude difference. In FIG. 19, the vertical axis indicates the phase difference.

It can be seen from FIG. 14 to FIG. 17 that, in the triplexer 1 of the practical example, the first filter 20 functions as a band-pass filter that passes signals having frequencies within its pass band (2.3 to 2.69 GHz) selectively. As shown in FIG. 18 and FIG. 19, in the pass band of the first filter 20 (2.3 to 2.69 GHz), the amplitude difference between the output signals of the balanced output terminals Rx21 and Rx22 is nearly zero, and the phase difference between the output signals of the balanced output terminals Rx21 and Rx22 is approximately 180°. This shows that the balanced output terminals Rx21 and Rx22 provide a balanced signal of favorable balance characteristics in the pass band of the first filter 20 (2.3 to 2.69 GHz).

Figure 20:
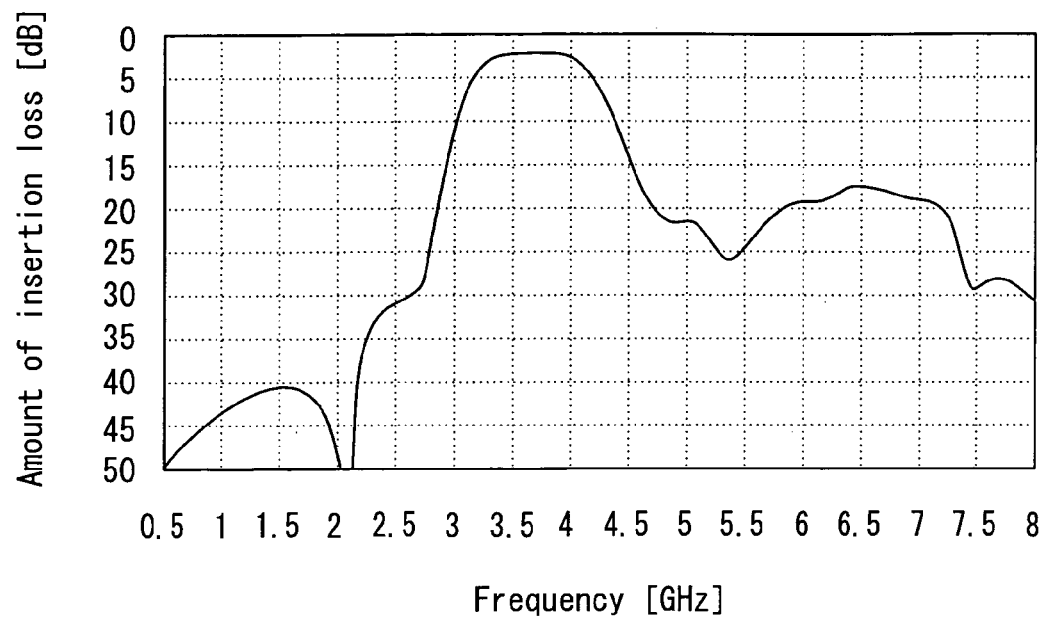
FIG. 20 is a characteristic chart showing the insertion loss characteristic of a signal path between the input terminal and second balanced output terminals of the triplexer of the practical example.
Figure 21:
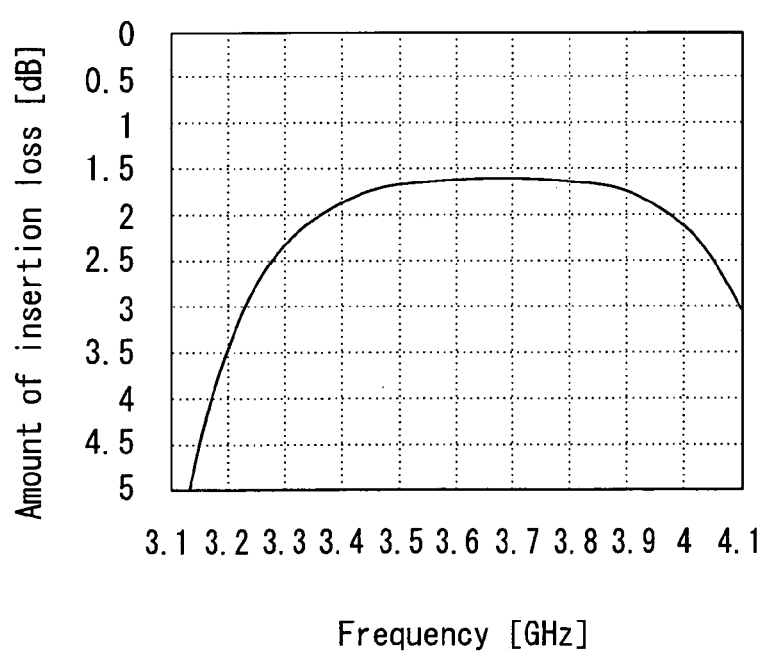
FIG. 21 is a magnified characteristic chart showing a part of the characteristic chart of FIG. 20.
Figure 22:
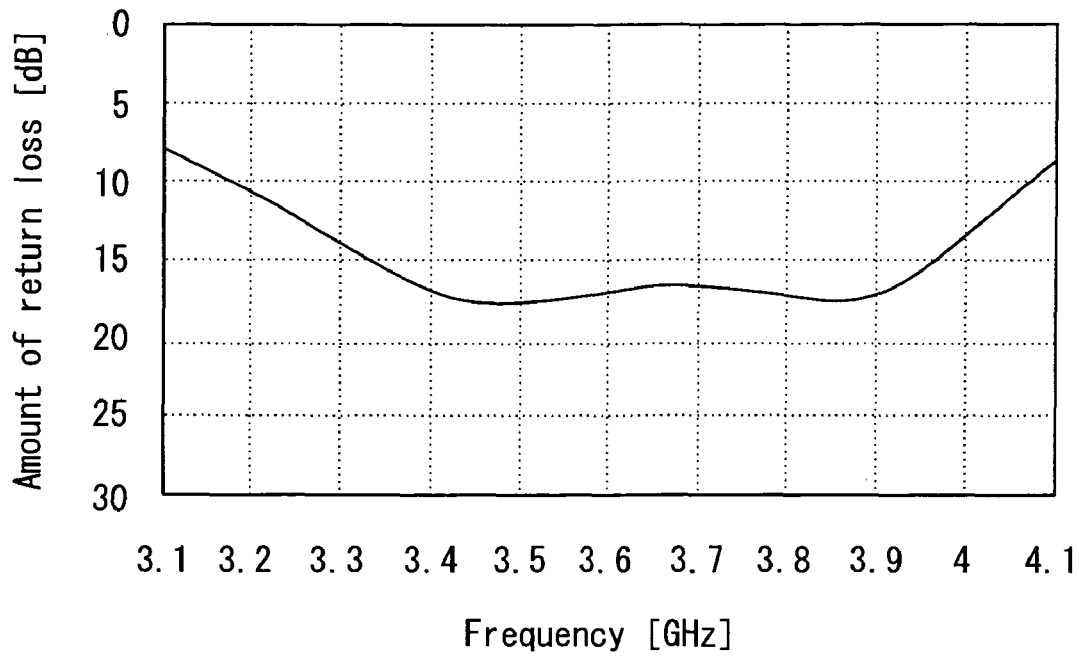
FIG. 22 is a characteristic chart showing a return loss characteristic at the input terminal of the triplexer of the practical example in a frequency range that covers the pass band of the second filter.
Figure 23:
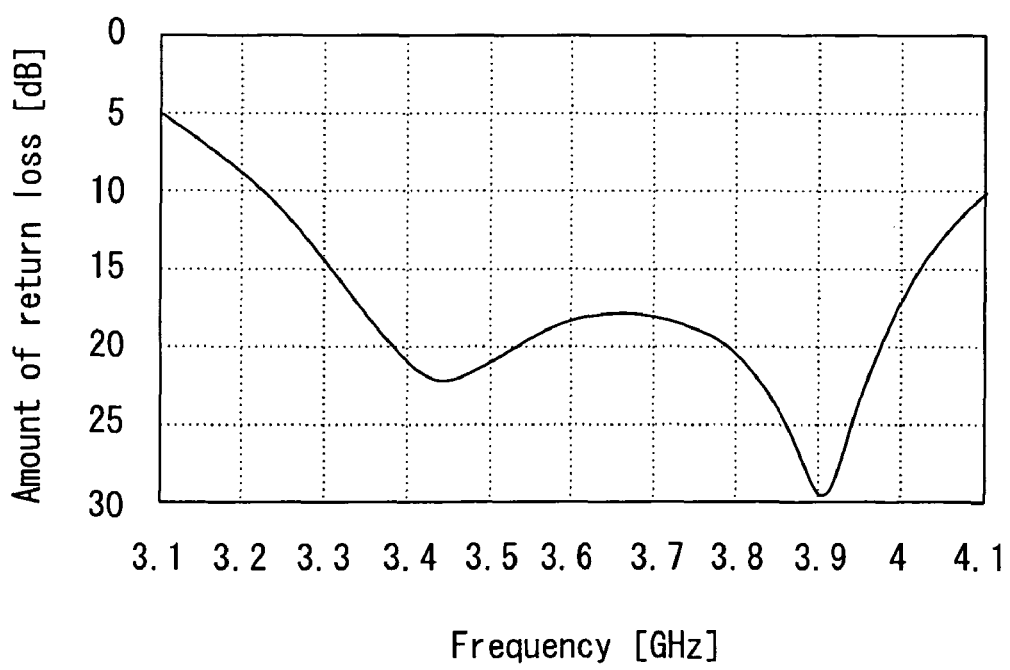
FIG. 23 is a characteristic chart showing a return loss characteristic at the second balanced output terminals of the triplexer of the practical example.
Figure 24:
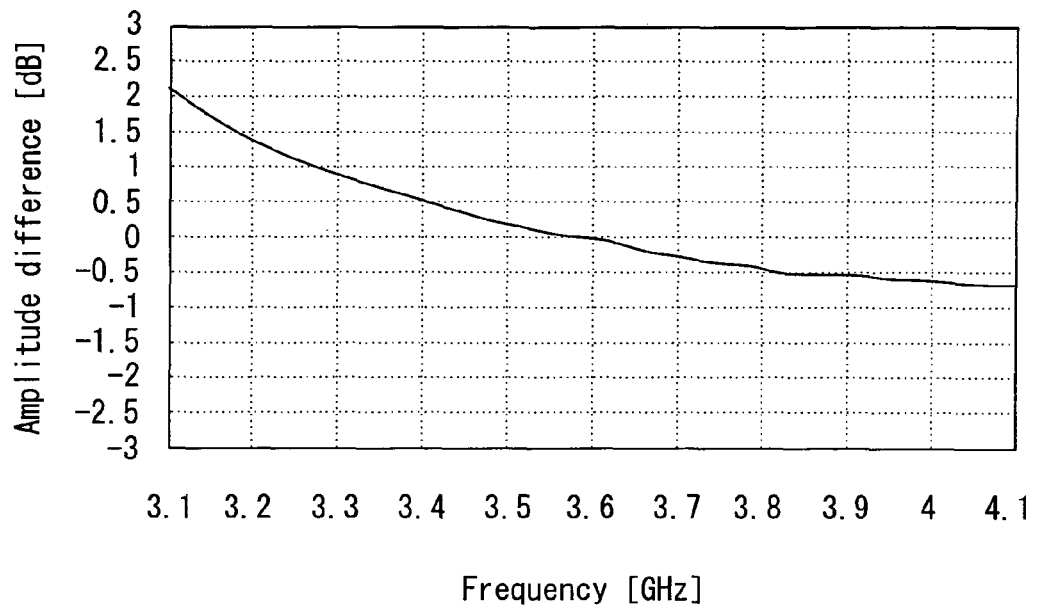
FIG. 24 is a characteristic chart showing the frequency characteristic of an amplitude difference between the output signals of the second balanced output terminals of the triplexer of the practical example.
Figure 25:
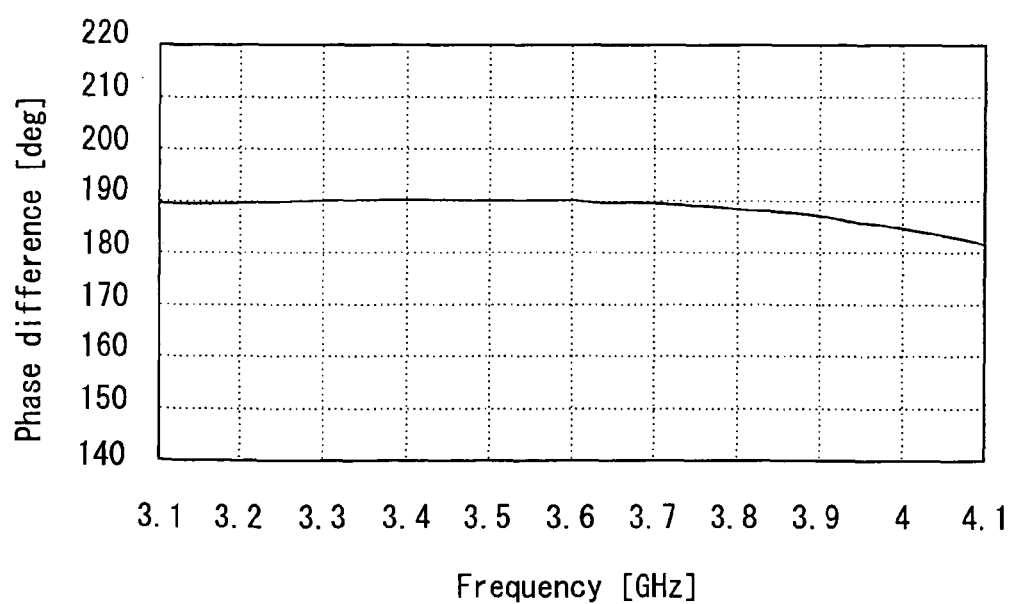
FIG. 25 is a characteristic chart showing the frequency characteristic of a phase difference between the output signals of the second balanced output terminals of the triplexer of the practical example.

Next, reference is made to FIG. 20 to FIG. 25 to describe the characteristics of the signal path between the input terminal ANT and the second balanced output terminals Rx31 and Rx32 of the triplexer 1 according to the practical example. FIG. 20 shows the insertion loss characteristic of the signal path between the input terminal ANT and the second balanced output terminals Rx31 and Rx32. FIG. 21 is an enlarged view of a part of FIG. 20. FIG. 22 shows a return loss characteristic at the input terminal ANT in a frequency range that covers the pass band of the second filter 30. FIG. 23 shows a return loss characteristic at the second balanced output terminals Rx31 and Rx32. FIG. 24 shows the frequency characteristic of an amplitude difference between the output signals of the second balanced output terminals Rx31 and Rx32. FIG. 25 shows the frequency characteristic of a phase difference between the output signals of the second balanced output terminals Rx31 and Rx32. In FIG. 20 to FIG. 25, the horizontal axis indicates the frequency. In FIG. 20 and FIG. 21, the vertical axis indicates the amount of insertion loss. In FIG. 22 and FIG. 23, the vertical axis indicates the amount of return loss. In FIG. 24, the vertical axis indicates the amplitude difference. In FIG. 25, the vertical axis indicates the phase difference.

It can be seen from FIG. 20 to FIG. 23 that, in the triplexer 1 of the practical example, the second filter 30 functions as a band-pass filter that passes signals having frequencies within its pass band (3.4 to 3.8 GHz) selectively. As shown in FIG. 24 and FIG. 25, in the pass band of the second filter 30 (3.4 to 3.8 GHz), the amplitude difference between the output signals of the balanced output terminals Rx31 and Rx32 is nearly zero, and the phase difference between the output signals of the balanced output terminals Rx31 and Rx32 is approximately 180°. This shows that the balanced output terminals Rx31 and Rx32 provide a balanced signal of favorable balance characteristics in the pass band of the second filter 30 (3.4 to 3.8 GHz).

Figure 26:
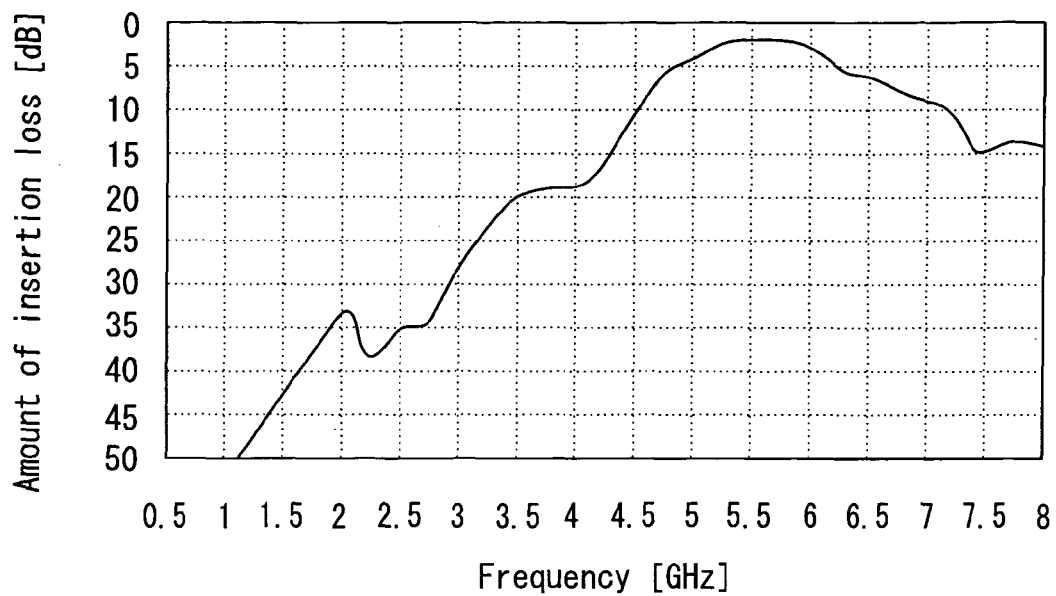
FIG. 26 is a characteristic chart showing the insertion loss characteristic of a signal path between the input terminal and third balanced output terminals of the triplexer of the practical example.
Figure 27:
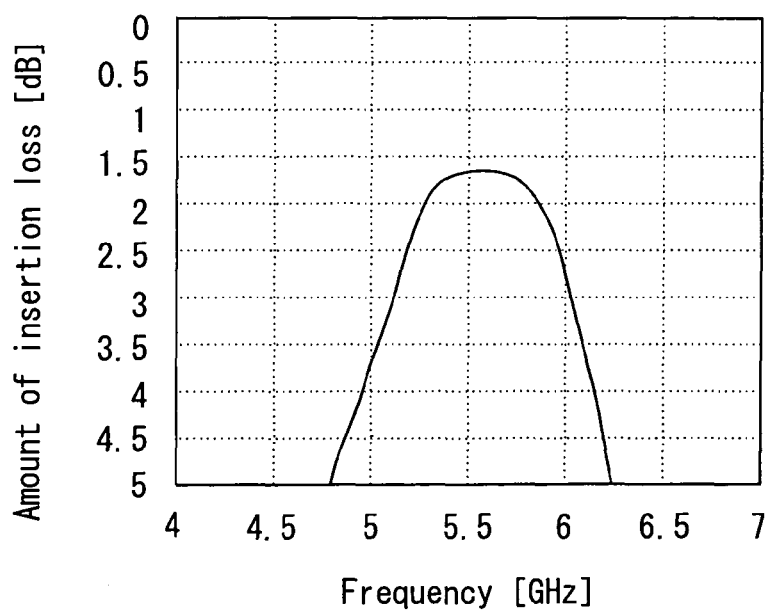
FIG. 27 is a magnified characteristic chart showing a part of the characteristic chart of FIG. 26.
Figure 28:
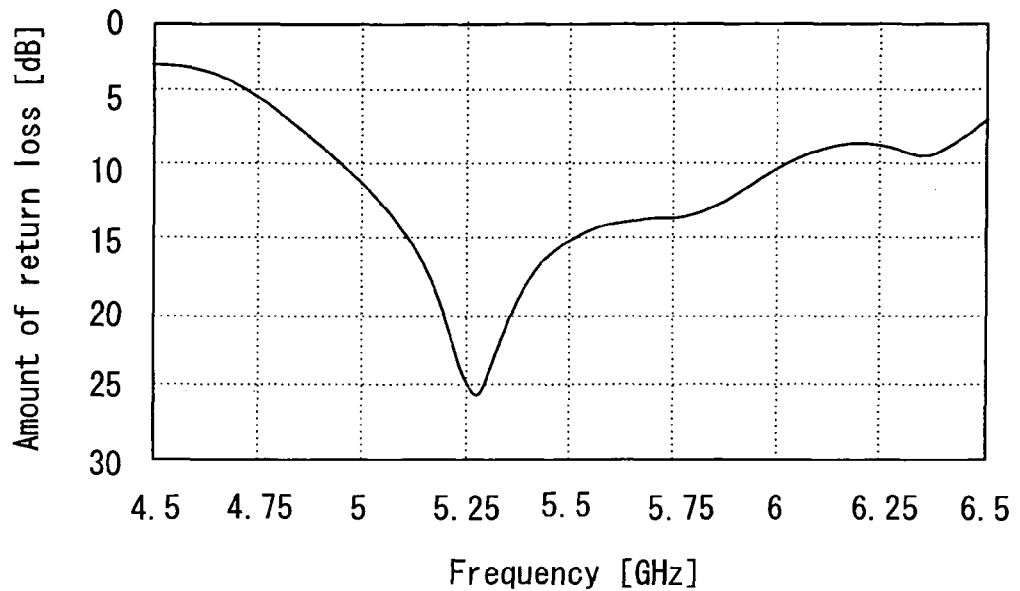
FIG. 28 is a characteristic chart showing a return loss characteristic at the input terminal of the triplexer of the practical example in a frequency range that covers the pass band of the third filter.
Figure 29:
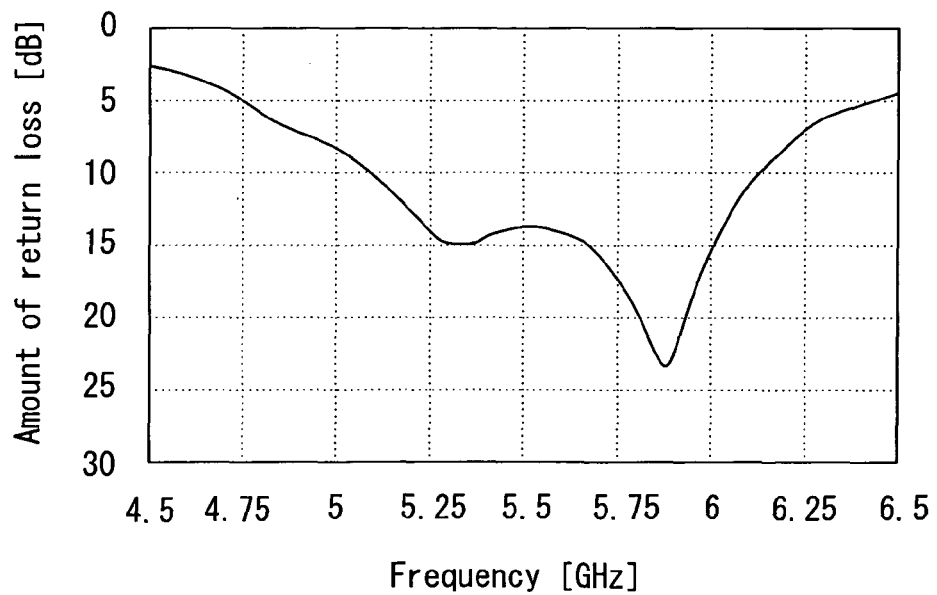
FIG. 29 is a characteristic chart showing a return loss characteristic at the third balanced output terminals of the triplexer of the practical example.
Figure 30:
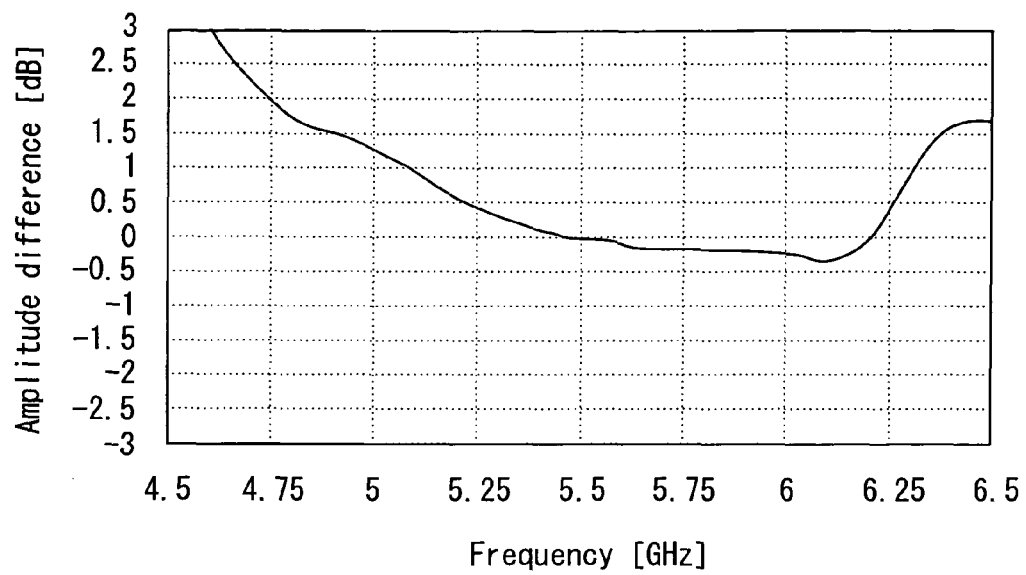
FIG. 30 is a characteristic chart showing the frequency characteristic of an amplitude difference between the output signals of the third balanced output terminals of the triplexer of the practical example.
Figure 31:
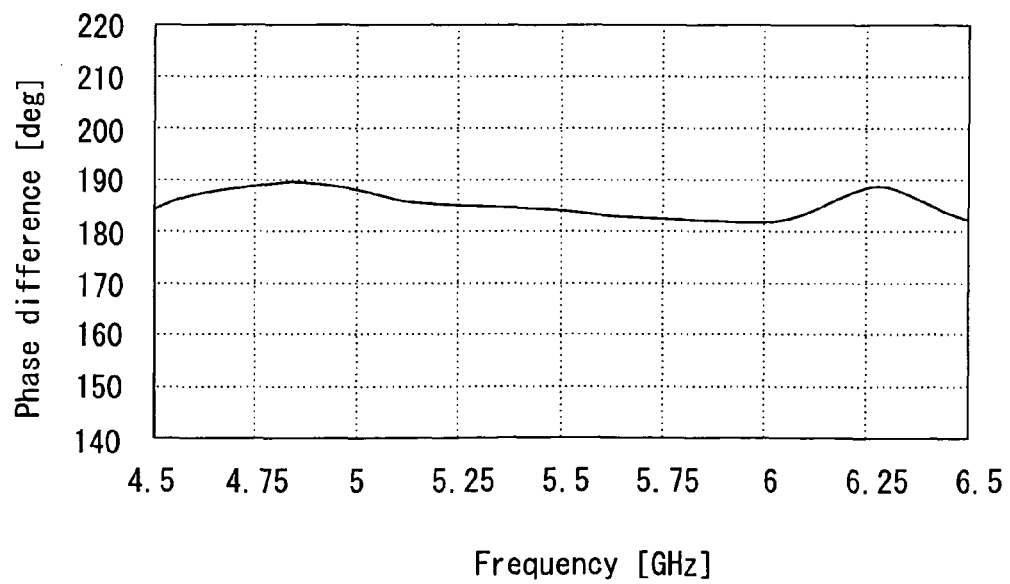
FIG. 31 is a characteristic chart showing the frequency characteristic of a phase difference between the output signals of the third balanced output terminals of the triplexer of the practical example.

Next, reference is made to FIG. 26 to FIG. 31 to describe the characteristics of the signal path between the input terminal ANT and the third balanced output terminals Rx51 and Rx52 of the triplexer 1 according to the practical example. FIG. 26 shows the insertion loss characteristic of the signal path between the input terminal ANT and the third balanced output terminals Rx51 and Rx52. FIG. 27 is an enlarged view of a part of FIG. 26. FIG. 28 shows a return loss characteristic at the input terminal ANT in a frequency range that covers the pass band of the third filter 50. FIG. 29 shows a return loss characteristic at the third balanced output terminals Rx51 and Rx52. FIG. 30 shows the frequency characteristic of an amplitude difference between the output signals of the third balanced output terminals Rx51 and Rx52. FIG. 31 shows the frequency characteristic of a phase difference between the output signals of the third balanced output terminals Rx51 and Rx52. In FIG. 26 to FIG. 31, the horizontal axis indicates the frequency. In FIG. 26 and FIG. 27, the vertical axis indicates the amount of insertion loss. In FIG. 28 and FIG. 29, the vertical axis indicates the amount of return loss. In FIG. 30, the vertical axis indicates the amplitude difference. In FIG. 31, the vertical axis indicates the phase difference.

It can be seen from FIG. 26 to FIG. 29 that, in the triplexer 1 of the practical example, the third filter 50 functions as a band-pass filter that passes signals having frequencies within its pass band (5.15 to 5.875 GHz) selectively. As shown in FIG. 30 and FIG. 31, in the pass band of the third filter 50 (5.15 to 5.875 GHz), the amplitude difference between the output signals of the balanced output terminals Rx51 and Rx52 is nearly zero, and the phase difference between the output signals of the balanced output terminals Rx51 and Rx52 is approximately 180°. This shows that the balanced output terminals Rx51 and Rx52 provide a balanced signal of favorable balance characteristics in the pass band of the third filter 50 (5.15 to 5.875 GHz).

The present invention is not limited to the foregoing embodiment but can be carried out in various modifications. For example, the filter 20 may be configured so that the pair of input resonators L21 and L24 are directly connected to the pair of output resonators L23 and L26 without the pair of resonators L22 and L25, like the filters 30 and 50. The filter 20 may also be configured to include two or more pairs of resonators between the pair of input resonators L21, L24 and the pair of output resonators L23, L26 so that the pair of input resonators L21 and L24 are coupled to the pair of output resonators L23 and L26 through the two or more pairs of resonators. In addition, each of the filters 30 and 50 may be configured so that the pair of input resonators and the pair of output resonators sandwich one or more other pairs of resonators therebetween so that the pair of input resonators are coupled to the pair of output resonators through the one or more other pairs of resonators.

The means for adjusting the impedance characteristics of the first to third signal paths from the input terminal ANT to the first to third balanced output terminals is not limited to the phase lines 61, 62 and 63 and the capacitor C57 that are arranged as shown in FIG. 1. The adjusting means may be designed as appropriate according to the characteristics of the first to third signal paths.

It is apparent that the present invention can be carried out in various forms and modifications in the light of the foregoing descriptions. Accordingly, within the scope of the following claims and equivalents thereof, the present invention can be carried out in forms other than the foregoing most preferable embodiment.

What is claimed is:

1. A balanced-output triplexer comprising:
an input terminal for inputting a first unbalanced signal of a first frequency band, a second unbalanced signal of a second frequency band higher than the first frequency band, and a third unbalanced signal of a third frequency band higher than the second frequency band;
a pair of first balanced output terminals for outputting a first balanced signal corresponding to the first unbalanced signal;
a pair of second balanced output terminals for outputting a second balanced signal corresponding to the second unbalanced signal;
a pair of third balanced output terminals for outputting a third balanced signal corresponding to the third unbalanced signal;
a first filter provided between the input terminal and the pair of first balanced output terminals, for passing signals having frequencies within the first frequency band selectively, and for converting the first unbalanced signal into the first balanced signal and outputting the first balanced signal to the pair of first balanced output terminals;
a second filter provided between the input terminal and the pair of second balanced output terminals, for passing signals having frequencies within the second frequency band selectively, and for converting the second unbalanced signal into the second balanced signal and outputting the second balanced signal to the pair of second balanced output terminals;
a third filter provided between the input terminal and the pair of third balanced output terminals, for passing signals having frequencies within the third frequency band selectively, and for converting the third unbalanced signal into the third balanced signal and outputting the third balanced signal to the pair of third balanced output terminals; and
a layered substrate including a plurality of dielectric layers stacked, wherein:
all of the first to third filters are provided within the layered substrate;
the layered substrate has a plurality of surfaces each of which is defined by a plurality of sides;

the first to third balanced output terminals are disposed to be adjacent to one of the plurality of sides of one of the plurality of surfaces of the layered substrate;

the layered substrate includes a ground layer connected to a ground, the ground layer being disposed such that first and second areas sandwiching the ground layer are created within the layered substrate;

the first filter is disposed in the first area; and the second filter and the third filter are disposed in the second area.

2. A balanced-output triplexer comprising:

an input terminal for inputting a first unbalanced signal of a first frequency band, a second unbalanced signal of a second frequency band higher than the first frequency band, and a third unbalanced signal of a third frequency band higher than the second frequency band;

a pair of first balanced output terminals for outputting a first balanced signal corresponding to the first unbalanced signal;

a pair of second balanced output terminals for outputting a second balanced signal corresponding to the second unbalanced signal;

a pair of third balanced output terminals for outputting a third balanced signal corresponding to the third unbalanced signal;

a first filter provided between the input terminal and the pair of first balanced output terminals, for passing signals having frequencies within the first frequency band selectively, and for converting the first unbalanced signal into the first balanced signal and outputting the first balanced signal to the pair of first balanced output terminals;

a second filter provided between the input terminal and the pair of second balanced output terminals, for passing signals having frequencies within the second frequency band selectively, and for converting the second unbalanced signal into the second balanced signal and outputting the second balanced signal to the pair of second balanced output terminals;

a third filter provided between the input terminal and the pair of third balanced output terminals, for passing signals having frequencies within the third frequency band selectively, and for converting the third unbalanced signal into the third balanced signal and outputting the third balanced signal to the pair of third balanced output terminals; and a layered substrate including a plurality of dielectric layers stacked, wherein:

all of the first to third filters are provided within the layered substrate;

the layered substrate has a plurality of surfaces each of which is defined by a plurality of sides;

the first to third balanced output terminals are disposed to be adjacent to one of the plurality of sides of one of the plurality of surfaces of the layered substrate;

each of the first to third filters includes a pair of resonators that are connected to the corresponding pair of balanced output terminals, each of the resonators having an open end and a short-circuited end; and each of the pair of resonators is disposed such that a line connecting the open end to the short-circuited end is in parallel with the one of the plurality of sides to which the first to third balanced output terminals are adjacent.

* * * * *